(12) United States Patent
Tomioka et al.

(10) Patent No.: US 8,698,254 B2
(45) Date of Patent: Apr. 15, 2014

(54) TUNNEL FIELD EFFECT TRANSISTOR AND METHOD FOR MANUFACTURING SAME

(75) Inventors: Katsuhiro Tomioka, Hokkaido (JP); Takashi Fukui, Hokkaido (JP); Tomotaka Tanaka, Hokkaido (JP)

(73) Assignee: National University Corporation Hokkaido University, Hokkaido (JP)

( * ) Notice: Subject to any disclaimer, the term of this patent is extended or adjusted under 35 U.S.C. 154(b) by 28 days.

(21) Appl. No.: 13/499,333

(22) PCT Filed: Sep. 29, 2010

(86) PCT No.: PCT/JP2010/005862
§ 371 (c)(1),
(2), (4) Date: Mar. 30, 2012

(87) PCT Pub. No.: WO2011/040012
PCT Pub. Date: Apr. 7, 2010

(65) Prior Publication Data
US 2012/0187376 A1    Jul. 26, 2012

(30) Foreign Application Priority Data

Sep. 30, 2009  (JP) ................................. 2009-227564

(51) Int. Cl.
*H01L 27/088*    (2006.01)

(52) U.S. Cl.
USPC ........................................................ 257/392

(58) Field of Classification Search
USPC ............ 257/27, 192, 200, E49.001, E29.091, 257/E29.242, E21.41, E29.118, 136, 242, 257/329, 135, E29.179, 327, 328, 404, 345, 257/268, 392, 213, 274, 348, E21.461
See application file for complete search history.

(56) References Cited

U.S. PATENT DOCUMENTS

| 2005/0274992 | A1 | 12/2005 | Appenzeller et al. |
| 2006/0019470 | A1* | 1/2006 | Seifert et al. ............... 438/483 |

(Continued)

FOREIGN PATENT DOCUMENTS

| EP | 1900681 A | 3/2008 |
| JP | 2008-072104 A | 3/2008 |

(Continued)

OTHER PUBLICATIONS

Bhuwalka, K.K., Schulze, J. and Eisele, I., "Scaling the vertical tunnel FET with tunnel bandgap modulation and gate workfunction engineering", IEEE transactions on electron devices, vol. 52, No. 5, May 2005, pp. 909-917.

(Continued)

*Primary Examiner* — Steven Loke
*Assistant Examiner* — Mouloucoulaye Inoussa
(74) *Attorney, Agent, or Firm* — Washida & Associates

(57) ABSTRACT

A tunnel field effect transistor is capable of operating at a low subthreshold and is able to be manufactured easily. The tunnel field effect transistor includes a group IV semiconductor substrate having a (111) surface and doped so as to have a first conductivity type, a group III-V compound semiconductor nanowire arranged on the (111) surface and containing a first region connected to the (111) surface and a second region doped so as to have a second conductivity type, a source electrode connected to the group IV semiconductor substrate; a drain electrode connected to the second region, and a gate electrode for applying an electric field to an interface between the (111) surface and the group III-V compound semiconductor nanowire, or an interface between the first region and the second region.

9 Claims, 22 Drawing Sheets

(56) References Cited

U.S. PATENT DOCUMENTS

| | | |
|---|---|---|
| 2008/0067495 A1 | 3/2008 | Verhulst |
| 2008/0224224 A1 | 9/2008 | Vandenderghe et al. |
| 2010/0221882 A1* | 9/2010 | Samuelson et al. ........... 438/268 |
| 2012/0045879 A1 | 2/2012 | Verhulst et al. |

FOREIGN PATENT DOCUMENTS

| | | |
|---|---|---|
| JP | 2008-103702 A | 5/2008 |
| JP | 2008-252086 A | 10/2008 |
| WO | 2007-086008 A | 8/2007 |

OTHER PUBLICATIONS

Bhuwalka, K.K., Schulze, J. and Eisele, I., "A simulation approach to optimize the electrical parameters of a vertical tunnel FET", IEEE transactions on electron devices, vol. 52, No. 7, Jul. (2005), pp. 1541-1547.

Kunio Takayanagi, et al. "Structure Analysis of Si(111)-7 x 7 Reconstructed Surface by Transmission Electron Diffraction", Surf. Sci. vol. 164, (1985), p. 367-392.

Ramgopal Rao V, et al. "Simulation, Fabrication and Characterization of High Performance Planar-Doped-Barrier Sub 100 nm Channel MOSFETs", IEDM' 97, Dec. 7, 1997, P811-814.

* cited by examiner

TUNNEL FIELD EFFECT TRANSISTOR AND METHOD FOR MANUFACTURING SAME

TECHNICAL FIELD

The present invention relates to a tunnel field effect transistor including a group III-V compound semiconductor nanowire and a manufacturing method thereof.

BACKGROUND ART

Semiconductor microprocessors and large scale integrated circuits are manufactured by integrating elements such as metal-oxide-semiconductor (hereinafter referred to as "MOS") field effect transistor (hereinafter referred to as "FET") on a semiconductor substrate. Complementary MOSFETs (hereinafter referred to as "CMOS") are generally basic elements (switch elements) of such integrated circuits. As the material for semiconductor substrates, silicon which is group IV semiconductor is mainly used. The degree of integration and performance of semiconductor microprocessors and large scale integrated circuits can be improved by reducing the size of transistors making up a CMOS. One of problems when reducing the size of the CMOS is an increase of power consumption. An increase in the number of CMOSs that can be mounted on one microchip and an increase of leakage current caused by a short channel effect can be cited as two of the major causes for the increase of power consumption. Of the two, the increase of leakage current brings about an increase of a supply voltage. Therefore, it is necessary to suppress the leakage current and reduce the operating voltage for each CMOS.

As an index indicating a switch characteristic of a CMOS, a subthreshold (mV/digit) is used. The subthreshold corresponds to a minimum drive voltage to drive the MOSFET into an ON state. The switch characteristic of the conventional MOSFET is based on a diffusion phenomenon of electrons and positive holes (carriers). Therefore, with the conventional MOSFET, a theoretical minimum value of a subthreshold slope is 60 mV/digit and it is not possible to realize a switch characteristic indicating a smaller subthreshold than this.

A tunnel FET (hereinafter referred to as "TFET") is reported as a switch element that operates at a smaller subthreshold beyond this physical theoretical limit (e.g., see Non-Patent Literatures 1 and 2). Since the TFET has no short channel effect and can realize a high ON/OFF ratio at a low voltage, and is therefore considered as a prevailing candidate for a next-generation switch element. In recent years, TFETs using a nanowire are reported (e.g., see Patent Literatures 1 to 4).

Patent Literature 1 describes a TFET having a nanowire including an n-type doped region (source/drain region), undoped region (channel region) and p-type doped region (drain/source region). A gate dielectric layer is formed on the undoped region (channel region) and a gate electrode is arranged on the gate dielectric layer. This TFET is manufactured by doping an n-type dopant into a first region of the nanowire to form a source/drain region and doping a p-type dopant into a second region to form a drain/source region.

Patent Literatures 2 to 4 describe a TFET having a nanowire including an n-type doped region (source/drain region), undoped/low doped region (channel region) and p-type doped region (drain/source region). A gate dielectric layer is formed on an undoped/low doped region (channel region) and the gate electrode is arranged on the gate dielectric layer. In this TFET, a tunnel phenomenon occurs on a junction interface between the source region and the channel region. This TFET is manufactured by growing a nanowire using a metal catalyst placed on the substrate surface, then doping an n-type or p-type dopant to form the source region, channel region and drain region.

CITATION LIST

Patent Literature
Patent Literature 1
US Patent Application Publication No. 2005/0274992
Patent Literature 2
Japanese Patent Application Laid-Open No. 2008-72104
Patent Literature 3
Japanese Patent Application Laid-Open No. 2008-103702
Patent Literature 4
Japanese Patent Application Laid-Open No. 2008-252086
Non-Patent Literature
Non-Patent Literature 1
Bhuwalka, K. K., Schulze, J. and Eisele, I., "Scaling the vertical tunnel FET with tunnel bandgap modulation and gate workfunction engineering", IEEE transactions on electron devices, Vol. 52, No. 5, May (2005), pp. 909-917.
Non-Patent Literature 2
Bhuwalka, K. K., Schulze, J. and Eisele, I., "A simulation approach to optimize the electrical parameters of a vertical tunnel FET", IEEE transactions on electron devices, Vol. 52, No. 7, July (2005), pp. 1541-1547.

SUMMARY OF THE INVENTION

Technical Problem

However, the technique in Patent Literature 1 has a disadvantage that a new material cannot be introduced.

Furthermore, the techniques in Patent Literatures 2 to 4 have a problem in a nanowire manufacturing step. Since a nanowire is manufactured through a vapor phase-liquid phase-solid phase mechanism using a metal catalyst, these techniques cannot prevent influences from the metal catalyst. These techniques identify a conductive type and impurity concentration in each region of a TFET, but since the metal catalyst is mixed as an impurity, it is practically impossible to manufacture a nanowire of the identified structure. Furthermore, these techniques use different materials for the first semiconductor and the second semiconductor in a hetero region (hetero section) where a tunnel phenomenon occurs. When, for example, a nanowire made of group III-V compound semiconductor is manufactured on a nanowire made of group IV semiconductor, the group IV semiconductor has a non-polarity crystal structure and the group III-V compound semiconductor has a polar crystal structure, and therefore the growth direction diverges in multiple directions. Thus, the use of a technique using different materials for the first semiconductor and the second semiconductor causes the nanowire growth direction to diverge in multiple directions, but Patent Literatures 2 to 4 do not disclose any technique for solving this problem.

It is an object of the present invention to provide a TFET capable of operating at a small subthreshold (60 mV/digit or below) and able to be manufactured easily, and a manufacturing method thereof.

Solution to Problem

The present inventor discovered that above-described problems can be solved by manufacturing a nanowire made of a group III-V compound semiconductor on a (111) surface of a group IV semiconductor substrate and manufacturing a TFET using the semiconductor structure acquired, and further added reviews to perfect the present invention.

That is, a first aspect of the present invention relates to a tunnel field effect transistor (TFET) and a switch element shown below.

[1] A tunnel field effect transistor including: a group IV semiconductor substrate having a (111) surface and doped so as to have a first conductivity type; a group III-V compound semiconductor nanowire arranged on the (111) surface of the group IV semiconductor substrate and containing a first region connected to the (111) surface of the group IV semiconductor substrate and a second region doped so as to have a second conductivity type different from the first conductivity type; a source electrode or drain electrode that is not in contact with the group III-V compound semiconductor nanowire and is connected to the group IV semiconductor substrate; a drain electrode or source electrode that is connected to the second region of the group III-V compound semiconductor nanowire; and a gate electrode for applying an electric field to an interface between the (111) surface of the group IV semiconductor substrate and the group III-V compound semiconductor nanowire.

[2] A tunnel field effect transistor including: a group IV semiconductor substrate containing a first region having a (111) surface and a second region doped so as to have a first conductivity type; a group III-V compound semiconductor nanowire arranged on the (111) surface of the first region of the group IV semiconductor substrate and undoped or doped so as to have a second conductivity type different from the first conductivity type; a source electrode or drain electrode connected to the group III-V compound semiconductor nanowire; a drain electrode or source electrode that is not in contact with the group III-V compound semiconductor nanowire and is connected to the second region of the group IV semiconductor substrate; and a gate electrode for applying an electric field to an interface between the group III-V compound semiconductor nanowire and the (111) surface of the group IV semiconductor substrate.

[3] The tunnel field effect transistor according to [1] or [2], wherein the group IV semiconductor is silicon or germanium, the group III-V compound semiconductor is InAs, InP, GaAs, GaN, InSb, GaSb, AlSb, AlGaAs, InGaAs, InGaN, AlGaN, GaNAs, InAsSb, GaAsSb, InGaSb, AlInSb, InGaAlN, AlInGaP, InGaAsP, GaInAsN, InGaAlSb, InGaAsSb or AlInGaPSb, and a longitudinal axis of the group III-V compound semiconductor nanowire is perpendicular to the (111) surface of the group IV semiconductor substrate.

[4] The tunnel field effect transistor according to any one of [1] to [3], further including a gate dielectric film arranged on a side of the group III-V compound semiconductor nanowire, wherein the gate electrode is arranged on the gate dielectric film.

[5] The tunnel field effect transistor according to any one of [1] to [4], wherein the interface between the (111) surface of the group IV semiconductor substrate and the group III-V compound semiconductor nanowire has neither dislocation nor defect.

[6] A switch element including the tunnel field effect transistor according to any one of [1] to [5].

Furthermore, a second aspect of the present invention relates to a method of manufacturing a tunnel field effect transistor (TFET) shown below.

[7] A method of manufacturing a tunnel field effect transistor having a group IV semiconductor substrate and a group III-V compound semiconductor nanowire, including a step of preparing a substrate including a group IV semiconductor substrate having a (111) surface and an insulating film covering the (111) surface and having an opening; a step of applying low temperature heat treatment to the substrate and converting the (111) surface exposed in the opening to a (111)1×1 surface; a step of supplying a group III raw material or group V raw material to the substrate under a low temperature condition and converting the (111) surface exposed in the opening to a (111)A surface or (111)B surface; a step of growing a group III-V compound semiconductor nanowire from the (111) surface exposed in the opening; a step of forming a gate electrode; and, a step of forming a source electrode or drain electrode on the group IV semiconductor substrate so as not to contact the group III-V compound semiconductor nanowire and forming a drain electrode or source electrode on the group III-V compound semiconductor nanowire.

[8] The manufacturing method according to [7], further including a step of applying high temperature heat treatment to the substrate before the step of applying low temperature heat treatment to the substrate and thereby removing a natural oxide film formed on the surface of the group IV semiconductor substrate.

[9] The manufacturing method according to [7] or [8], further including a step of supplying a group V raw material and a group III raw material alternately to the (111)1×1 surface converted to the (111)A surface or the (111)B surface and thereby forming a thin film of the group III-V compound semiconductor.

[10] The manufacturing method according to any one of [7] to [9], wherein the step of converting the (111) surface to the (111)1×1 surface and the step of converting the (111) surface to the (111)A surface or (111)B surface are performed sequentially or simultaneously.

[11] The manufacturing method according to any one of [7] to [11], wherein the group IV semiconductor is silicon or germanium, the group III raw material is a gas containing boron, aluminum, gallium, indium or titanium, the group V raw material is a gas containing nitrogen, phosphor, arsenic, antimony or bismuth, and the III-V compound semiconductor is InAs, InP, GaAs, GaN, InSb, GaSb, AlSb, AlGaAs, InGaAs, InGaN, AlGaN, GaNAs, InAsSb, GaAsSb, InGaSb, AlInSb, InGaAlN, AlInGaP, InGaAsP, GaInAsN, InGaAlSb, InGaAsSb or AlInGaPSb.

[12] The manufacturing method according to any one of [7] to [11], wherein the insulating film covering the (111) surface is a thermal oxide film of the surface of the group IV semiconductor substrate.

Advantageous Effects of Invention

The present invention can easily manufacture a TFET (switch element) that can operate at a small subthreshold (60 mV/digit or below). Using the TFET of the present invention makes it possible to improve a degree of integration and performance of a semiconductor microprocessor and a large scale integrated circuit while suppressing an increase in power consumption of the semiconductor microprocessor and the large scale integrated circuit.

DETAILED DESCRIPTION OF PREFERRED EMBODIMENTS

Figure 1:
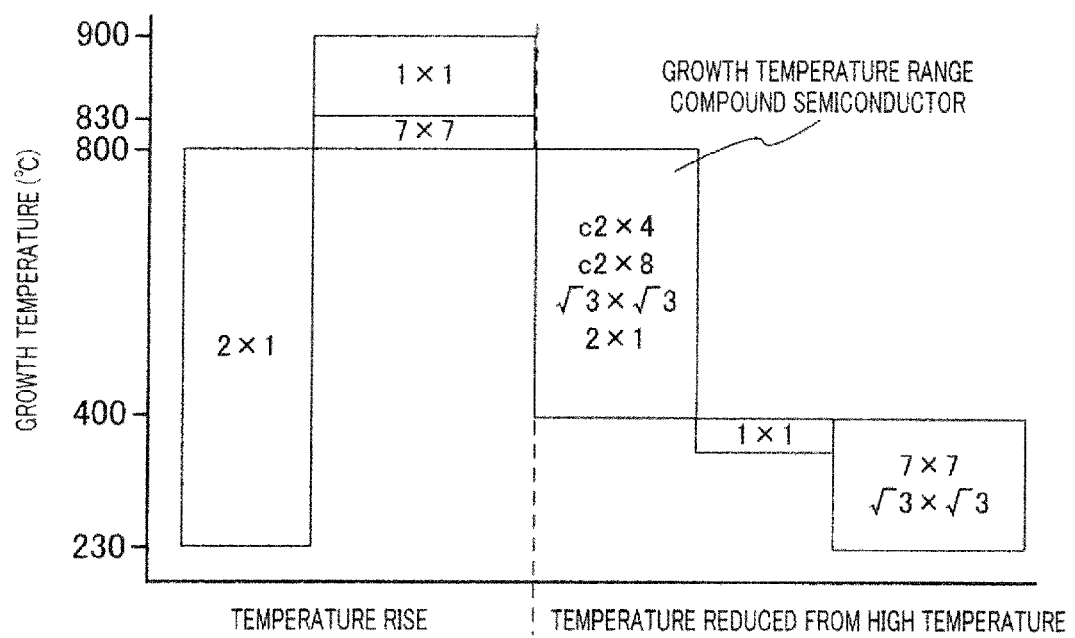
FIG. 1 is a classification diagram of a reconstructed structure (a phenomenon that the period of an array of surface atoms changes) of a silicon surface when a substrate temperature is raised and when the substrate temperature is lowered from a high temperature.

1. Tunnel Field Effect Transistor of Present Invention

A tunnel field effect transistor (TFET) according to the present invention includes a group IV semiconductor substrate, a group III-V compound semiconductor nanowire, a source electrode, a drain electrode and a gate electrode. A plurality of TFETs may also be formed on one group IV semiconductor substrate. A feature of the TFET of the present invention is that a (111) surface of the group IV semiconductor substrate and the group III-V compound semiconductor nanowire form a junction interface. In the TFET of the present invention, a tunnel phenomenon occurs in this junction interface.

The group IV semiconductor substrate is a substrate having a (111) surface and made of group IV semiconductor, such as a silicon substrate or germanium substrate. The group IV semiconductor substrate is, for example, a silicon (111) substrate or silicon (100) substrate. When the group IV semiconductor substrate is a silicon (100) substrate, a (111) surface is formed apart from the (100) surface (see Embodiments 3 and 4). Furthermore, the group IV semiconductor substrate may also be a group IV semiconductor substrate including a group IV semiconductor layer whose end face is a (111) surface (see Embodiment 5).

The group IV semiconductor substrate may be doped to be an n-type or p-type. At this time, the entire substrate may be doped or only part of the substrate may be doped. Furthermore, an insulating film may be formed on the surface of the group IV semiconductor substrate. Examples of the insulating film include a silicon oxide film or silicon nitride film.

The group III-V compound semiconductor nanowire is a structure made of group III-V compound semiconductor having a diameter of 2 to 100 nm, a length of 50 nm to 10 μm. The group III-V compound semiconductor nanowire is arranged on the (111) surface of the group IV semiconductor substrate so that a longitudinal axis thereof is perpendicular to the (111) surface. The group III-V compound semiconductor may be any one of semiconductor made of two elements, semiconductor made of three elements, semiconductor made of four elements and semiconductor made of more than four elements. Examples of the group III-V compound semiconductor made of two elements include InAs, InP, GaAs, GaN, InSb, GaSb and AlSb. Examples of the group III-V compound semiconductor made of three elements include AlGaAs, InGaAs, InGaN, AlGaN, GaNAs, InAsSb, GaAsSb, InGaSb and AlInSb. Examples of the group III-V compound semiconductor made of four or more elements include InGaAlN, AlInGaP, InGaAsP, GaInAsN, InGaAlSb, InGaAsSb and AlInGaPSb. The group III-V compound semiconductor nanowire may be doped to be an n-type or p-type. At this time, the entire nanowire may be doped or only part of the nanowire may be doped.

The source electrode is connected to the source region of the TFET of the present invention and the drain electrode is connected to the drain region of the TFET of the present invention. The source electrode and drain electrode are, for example, a Ti/Au alloy film or Ge/Au/Ni/Au alloy film or the like. The positions of the source electrode and drain electrode vary depending on the structure of the TFET of the present invention. For example, when the group IV semiconductor substrate functions as the source region, the first region of the group III-V compound semiconductor nanowire (bonded to the (111) surface of the group IV semiconductor substrate) functions as a channel region and the second region of the group III-V compound semiconductor nanowire (region other than the first region) functions as a drain region, the source electrode is arranged on the group IV semiconductor substrate and the drain electrode is arranged in the second region of the group III-V compound semiconductor nanowire (see Embodiments 1 and 2). On the other hand, when the group III-V compound semiconductor nanowire functions as a source region, the first region of the group IV semiconductor substrate (bonded to the group III-V compound semiconductor nanowire) functions as a channel region and the second region of the group IV semiconductor substrate (region other than the first region) functions as a drain region, the source electrode is arranged on the group III-V compound semiconductor nanowire and the drain electrode is arranged in the second region of the group IV semiconductor substrate (see Embodiments 3 and 4).

The gate electrode can apply an electric field to a junction interface between the group IV semiconductor substrate and the group III-V compound semiconductor nanowire. Normally, the gate dielectric film is arranged in the channel region (group IV semiconductor substrate or group III-V compound semiconductor nanowire) and the gate electrode is arranged on the gate dielectric film.

In the TFET of the present invention, the junction interface between the (111) surface of the group IV semiconductor substrate and the group III-V compound semiconductor nanowire preferably includes neither dislocation nor defect, but may also include a small number of dislocations or defects. To be more specific, the period of misfit dislocation on the junction interface needs only to be longer than the period of misfit dislocation calculated from lattice mismatch between the group IV semiconductor and the group III-V compound semiconductor. Furthermore, the density of threading dislocation on the junction interface needs only to fall within a range of 0 to 1010 dislocations/cm2. By manufacturing the TFET of the present invention using the method of manufacturing a TFET according to the present, which will be described later, it is possible to manufacture the TFET of the present invention having the junction interface basically including neither dislocation nor defect.

In the TFET of the present invention, the junction interface between the (111) surface of the group IV semiconductor substrate and the group III-V compound semiconductor nanowire functions as a tunnel layer. As shown in the embodiment, when a positive or negative bias is applied to the gate electrode, carriers in the source region (group IV semiconductor substrate or group III-V compound semiconductor nanowire) move into the channel region (group III-V compound semiconductor nanowire or group IV semiconductor substrate) through a tunnel phenomenon (an ON state is set). This operation corresponds to a switch operation of an n-type or p-type MOSFET of a CMOS switch. Since the height of an energy barrier of the junction interface varies depending on the type of the group III-V compound semiconductor making up the group III-V compound semiconductor nanowire, it is possible to arbitrarily control a supply voltage necessary for an ON state by changing the type of the group III-V compound semiconductor.

The TFET of the present invention can operate at a sub-threshold of 60 mV/digit or below by using a potential produced on the junction interface between the group IV semiconductor substrate and the group III-V compound semiconductor nanowire (see examples). Power consumption of the semiconductor device can be reduced by using the TFET of the present invention as a switch element. As a result, it is possible to realize power saving and a reduction of environmental load.

2. TFET manufacturing method of present invention

The TFET manufacturing method according to the present invention includes 1) a first step of preparing a substrate, 2) a second step of growing the group III-V compound semiconductor nanowire, 3) a third step of forming a gate electrode, and 4) a fourth step of forming a source electrode and a drain electrode.

It is a main feature of the TFET manufacturing method of the present invention to form the group III-V compound semiconductor nanowire on the (111) surface of the group IV semiconductor substrate without using any catalyst (first step, second step). The formation of the gate electrode (third step) and the formation of the source electrode and drain electrode (fourth step) can be realized using prior arts as appropriate.

1) Preparation of Substrate

In the first step, a substrate including the group IV semiconductor substrate that has the (111) surface and an insulating film that covers part of the (111) surface. The type of the group IV semiconductor substrate is not particularly limited as long as it has the (111) surface, and is, for example, an n-type silicon (111) substrate or p-type silicon (111) substrate. In the case where the group IV semiconductor substrate is a substrate that has no (111) surface (such as a silicon (100) substrate), the (111) surface is preferably exposed by anisotropic etching (see Embodiments 3 and 4). Furthermore, the group IV semiconductor substrate may be a group IV semiconductor substrate that has a group IV semiconductor layer whose end face is a (111) surface (see Embodiment 5).

The (111) surface of the group IV semiconductor substrate is covered with an insulating film that has an opening. The material of the insulating film for covering the (111) surface is not particularly limited as long as it is an inorganic insulating material. Examples of the inorganic insulating material include silicon oxide, silicon nitride or the like. The thickness of the insulating film for covering the (111) surface is not particularly limited, and it may be, for example, on the order of 20 nm. The silicon oxide film is formed by, for example, thermally oxidizing the silicon substrate. Of course, the insulating film may also be formed using a general thin film formation method such as sputtering.

1 or 2 or more openings for growing the group III-V compound semiconductor nanowire are formed on the insulating film for covering the (111) surface of the group IV semiconductor substrate. The opening can be formed using a fine patterning technique such as electron beam lithography, photolithography, nanoimprint lithography or the like. The (111) surface of the group IV semiconductor substrate is exposed to the outside through the opening. The shape of the opening is not particularly limited and can be determined arbitrarily. Examples of the shape of the opening include triangular, rectangular, hexagonal and circular. The diameter of the opening may be, for example, on the order of 2 to 100 nm. When the diameter of the opening is too large, many dislocations or defects may be formed on the junction interface between the (111) surface of the group IV semiconductor substrate and the group III-V compound semiconductor nanowire. When a plurality of openings are periodically arrayed on one group IV semiconductor substrate, the interval of openings may be on the order of 10 nm to several μm.

A natural oxide film is normally formed on the surface of the group IV semiconductor substrate. Since this natural oxide film interferes with the growth of the group III-V compound semiconductor nanowire, the natural oxide film is preferably removed. Therefore, after providing the opening on the insulating film that covers the (111) surface of the IV semiconductor substrate, it is preferable to remove the natural oxide film formed on the surface of the IV semiconductor substrate ((111) surface exposed inside the opening) by applying high temperature heat treatment thereto. High temperature heat treatment may be performed under a condition of approximately 900° C. in an atmosphere of inert gas such as a hydrogen gas, nitrogen gas or argon gas. By performing such high temperature heat treatment, the natural oxide film that covers the (111) surface exposed through the opening is removed and oxygen atoms are removed from the crystal structure on the interface between the group IV semiconductor and the natural oxide film. At locations at which oxygen atoms are removed, group III atoms or group V atoms are adsorbed instead of oxygen atoms (which will be described later).

Figure 2A:
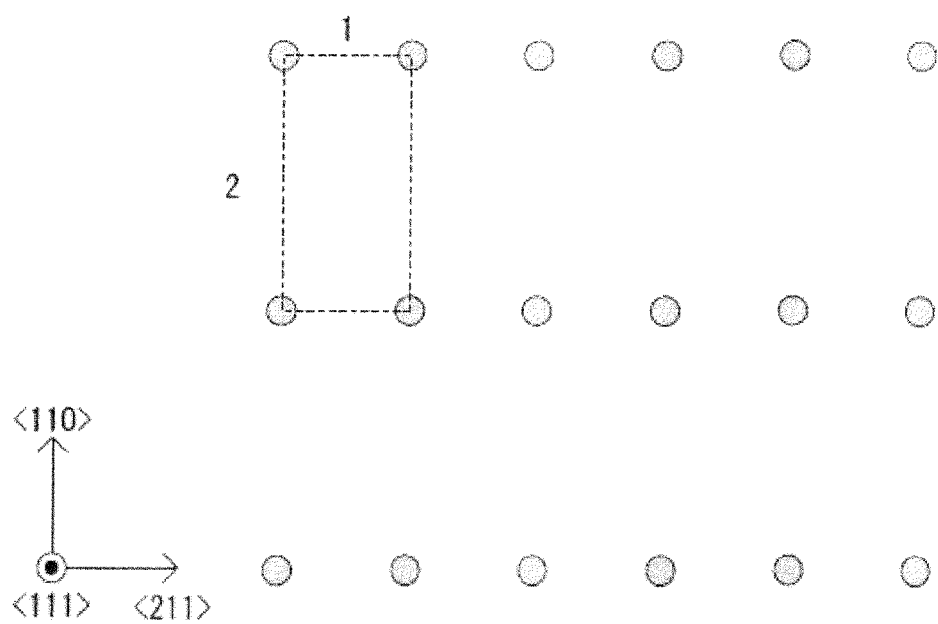
FIG. 2A is a schematic view illustrating a (111) surface.
Figure 2B:
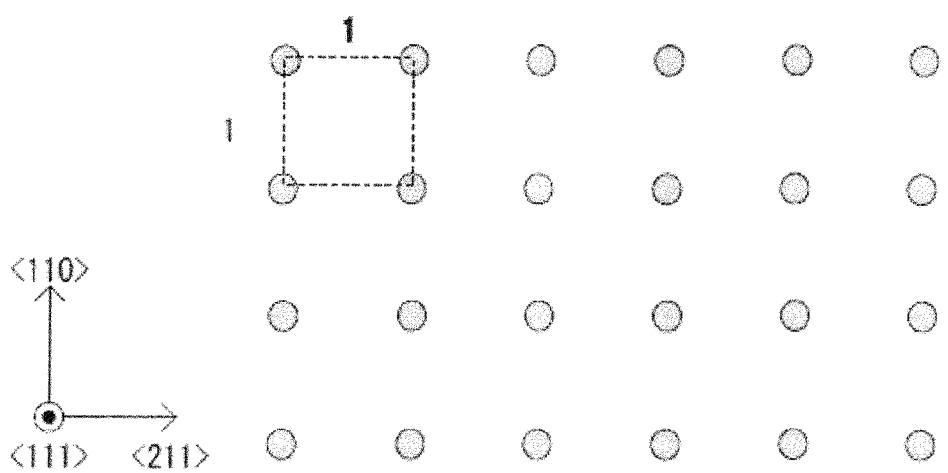
FIG. 2B is a schematic view illustrating a (111)1×1 surface.

The (111) surface after the high temperature heat treatment is configured with a 1×1 structure. However, if the temperature of the substrate is lowered as is, an irregular atom array is formed on the substrate surface as observed in the classification (compound semiconductor growth temperature range) shown in FIG. 1. However, when the temperature is further lowered down to the order of 400° C., the substrate surface is recovered to the 1×1 structure. Thus, according to the manufacturing method of the present invention, the substrate temperature is lowered to a low temperature (on the order of approximately 400° C.) after the high temperature heat treatment. Here, the "low temperature" refers to a temperature lower than a temperature necessary to grow the compound semiconductor nanowire. Lowering the substrate temperature in this way makes it possible to convert the (111)2×1 surface of the group IV semiconductor substrate to a (111)1×1 surface. The "(111)2×1 surface" refers to a surface where the minimum unit making up an atomic array is 2-atom distance× 1-atom distance as shown in FIG. 2A. On the other hand, the "(111)1×1 surface" refers to a surface where the minimum unit making up an atomic array is 1-atom distance×1-atom distance as shown in FIG. 2B.

As will be described later, the (111)1×1 surface of the group IV semiconductor substrate is converted to a (111)A surface or (111)B surface by a group III element or group V element. Here, the "(111)A surface" refers to a surface where a group III element is arranged on the surface. On the other hand, the "(111)B surface" refers to a surface where a group V element is arranged on the surface.

By converting the (111)1×1 surface of the group IV semiconductor substrate to the (111)A surface or (111)B surface, the group III-V compound semiconductor can grow more easily from the surface. The (111)A surface or (111)B surface of the group III-V compound semiconductor has a structure in which a (111)2×2 surface, that is, the minimum unit, is configured at a period of 2-atom distance×2-atom distance. Thus, when a group III element or group V element is arranged in a minimum unit smaller than the 2-atom distance×2-atom distance on the surface of the group IV semiconductor substrate, the group III-V compound semiconductor can easily grow on the surface.

On the other hand, a stable structure of the (111) surface that can be easily generated by applying heat treatment to a silicon substrate is reported to be a (111)7×7 surface (Surf. Sci. Vol. 164, (1985), p. 367-392). Even when a (111)7×7 surface is converted to a (111)A surface or (111)B surface, the minimum unit is an array period of 7-atom distance×7-atom distance. This minimum unit is greater than the minimum unit of an array period in a crystal structure of the group III-V compound semiconductor. Thus, the group III-V compound semiconductor is hard to grow on the surface.

Low temperature heat treatment for converting the (111) 2×1 surface of the group IV semiconductor substrate to the (111)1×1 surface may be performed at a temperature of approximately 350 to 450° C. (e.g., approximately 400° C.). The low temperature heat treatment is preferably performed in an atmosphere of inert gas such as hydrogen gas, nitrogen gas, argon gas, helium gas.

The (111)2×1 surface of the group IV semiconductor substrate is converted to the (111)1×1 surface through low temperature heat treatment, and is converted to the (111)A surface or (111)B surface by supplying a group III raw material or group V raw material to the surface of the IV semiconductor substrate. The group III raw material is preferably a gas containing boron, aluminum, gallium, indium or titanium (may also be an organic metal compound). The group III raw material is an organic alkyl metal compound such as trimethyl indium. The group V raw material is preferably a gas containing nitrogen, phosphor, arsenic, antimony or bismuth (may also be an organic metal compound). The group V raw material is, for example, hydrogenated arsenic (arsine; AsH3). The group III raw material or group V raw material is preferably supplied at 400 to 500° C.

The step of converting the surface of the group IV semiconductor substrate to the (111)A surface or (111)B surface may be performed after the step of converting the surface of the group IV semiconductor substrate to the (111)1×1 surface or may also be performed simultaneously with the step of converting it to the (111)1×1 surface. That is, the (111) surface of the group IV semiconductor substrate may be converted to the (111)A surface or (111)B surface while converting the (111) surface of the group IV semiconductor substrate to the (111)1×1 surface through low temperature heat treatment at approximately 400° C. by also supplying the group III raw material or group V raw material.

As described above, oxygen atoms are removed from the (111) surface when the natural oxide film is removed by applying heat treatment to the group IV semiconductor substrate at a high temperature (e.g., 900° C.). When the (111) 1×1 surface is obtained with oxygen atoms removed, a portion where bonding between group IV elements is cut is formed. As shown in FIG. 1, the (111) surface after the high temperature heat treatment is configured in a 1×1 structure and when the temperature is lowered as is, atomic arrays of various irregular periods are formed on the surface. By further lowering the temperature down to approximately 400° C., the (111) surface is recovered to the 1×1 structure. The recovered 1×1 structure is thermodynamically unstable. If a group III element or group V element is supplied in this condition, group III atoms or group V atoms are adsorbed to the (111) 1×1 surface so as to replace group IV atoms (e.g., silicon atoms) on the outermost surface with group III atoms or group V atoms, and a (111)A surface or (111)B surface is formed. Thus, the (111)A surface or (111)B surface is obtained relatively easily.

2) Manufacture of Group III-V Compound Semiconductor Nanowire

In the second step, the group III-V compound semiconductor nanowire is grown from the (111) surface of the group IV semiconductor substrate exposed through the opening. At this time, before growing the group III-V compound semiconductor nanowire, it is preferable to form a thin film of the group III-V compound semiconductor on the (111) surface of the group IV semiconductor substrate using an alternate raw material supply modulation method.

[Alternate Raw Material Supply Modulation Method]

A raw material gas containing the group III element and a raw material gas containing the group V element are alternately supplied to the group IV semiconductor substrate (hereinafter referred to as "alternate raw material supply modulation method") and a thin film of the group III-V compound semiconductor is formed on the (111)A surface or (111)B surface exposed through the opening of the insulating film. The thin film is preferably formed using this alternate raw material supply modulation method at a lower temperature than a temperature necessary to grow the group III-V compound semiconductor nanowire. For example, the thin film may be formed using the alternate raw material supply modulation method at approximately 400° C. or while raising the temperature from 400° C.

To be more specific, when the (111)A surface is formed on the group IV semiconductor substrate, the raw material gas containing the group III element is supplied first and then the raw material gas containing the group V element is supplied. Furthermore, the raw material gas containing the group III element and the raw material gas containing the group V element are alternately and repeatedly supplied. On the other hand, when the (111)B surface is formed on the group IV semiconductor substrate, the raw material gas containing the group V element is supplied first and then the raw material gas containing the group III element is supplied. Furthermore, the raw material gas containing the group V element and the raw material gas containing the group III element are alternately and repeatedly supplied.

The supply time for the raw material gas containing the group V element and the supply time for the raw material gas containing the group III element may be on the order of several seconds respectively. Furthermore, it is preferable to provide an interval of several seconds between the supply of the raw material gas containing the group V element and the supply of the raw material gas containing the group III element. The raw material gas containing the group V element and the raw material gas containing the group III element may be alternately supplied until the thin film of the group III-V compound semiconductor reaches a desired thickness. The thin film of the III-V compound semiconductor is formed by repeatedly supplying the gas several times.

This alternate raw material supply modulation method also has a compensation effect of being able to form the (111)A surface or (111)B surface again even when there is a portion that could not be converted when the (111)1×1 surface of the group IV semiconductor substrate is converted to the (111)A surface or (111)B surface. This is because the group IV element and group III element or group V element are bonded together through the alternate raw material supply modulation method.

After this, the substrate temperature is raised so as to grow the semiconductor nanowire, the thin film of the III-V compound semiconductor formed using the alternate raw material supply modulation method prevents the group III element or group IV element adsorbed to the substrate from dissociating from each other.

[Formation of Group III-V Compound Semiconductor Nanowire]

After forming the thin film of the III-V compound semiconductor, the group III-V compound semiconductor nanowire is grown through the opening of the insulating film from the (111) surface of the group IV semiconductor substrate. The group III-V compound semiconductor nanowire is grown using, for example, a metal-organic chemical vapor phase epitaxy method (hereinafter also referred to as "MOVPE method") or molecular beam epitaxy method (hereinafter also referred to as "MBE method"). The group III-V compound semiconductor nanowire is preferably grown using the MOVPE method.

The semiconductor nanowire can be formed according to the MOVPE method using a normal MOVPE apparatus. That is, a raw material gas containing the group III element and a raw material gas containing the group V element may be provided at a predetermined temperature and under a condition of a reduced pressure. When, for example, an InAs nanowire is formed, a gas containing hydrogenated arsenic (AsH3) and trimethyl indium may be provided at approximately 540° C. Furthermore, when a GaAs nanowire is formed, a gas containing hydrogenated arsenic and trimethyl gallium may be provided at approximately 750° C.

Through the above procedure, it is possible to form the group III-V compound semiconductor nanowire on the (111) surface of the group IV semiconductor substrate so that the longitudinal axis thereof becomes perpendicular to the (111) surface. The junction interface between the group III-V compound semiconductor nanowire formed in this way and the (111) surface of the group IV semiconductor substrate basically has neither dislocation nor defect.

Figure 3A:
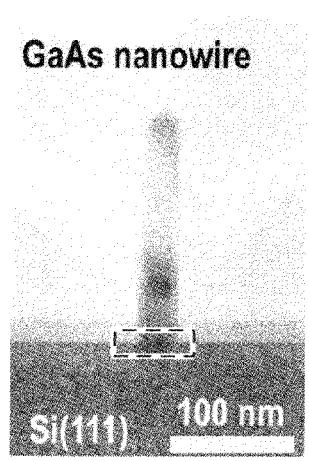
FIG. 3A is a cross-sectional photograph of a silicon substrate and a GaAs nanowire.
Figure 3B:
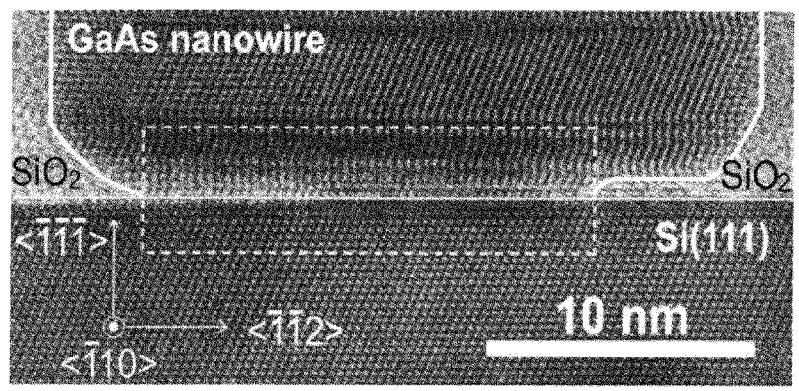
FIG. 3B is an enlarged photograph of a region surrounded by a broken line in FIG. 3A.
Figure 3C:
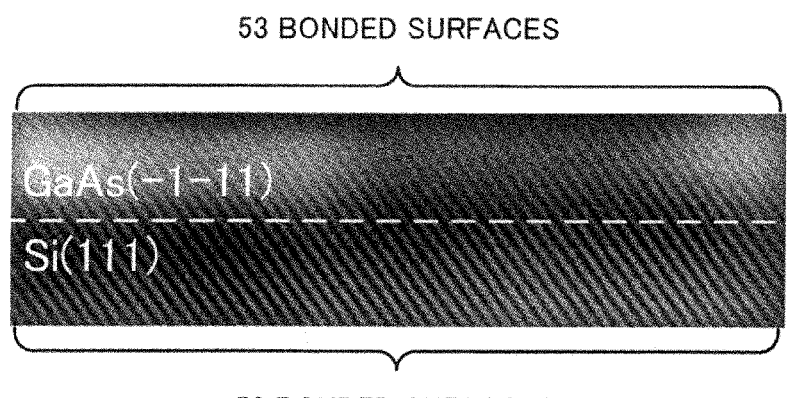
FIG. 3C is a Fourier transform diagram of the region enclosed by a broken line in FIG. 3B.

FIG. 3 is a photograph showing the junction interface with no misfit dislocation or threading dislocation. Here, an example is shown where a GaAs nanowire is formed on a silicon substrate. The diameter of the opening of the insulating film is 20 nm. FIG. 3A is a cross-sectional photograph (TEM observed image) of the silicon substrate and GaAs nanowire. FIG. 3B is an enlarged image (high resolution TEM observed image) of the region enclosed by a broken line in FIG. 3A. FIG. 3C is a Fourier transform diagram of the region enclosed by a broken line in FIG. 3B. As shown in FIG. 3C, the (111) surface of silicon and the (−1-11) surface of GaAs match in that the number of bonded surfaces is 53 and there is no misfit dislocation on the junction interface. There is no threading dislocation either. Since a lattice mismatch between silicon and GaAs is 3.9%, misfit dislocation is normally introduced at a period of 8 nm. Correspondingly, by manufacturing the GaAs nanowire through the above procedure, it is possible to make the period of misfit dislocation greater than the period of misfit dislocation (8 nm) calculated from the period mismatch (infinite in this case). Furthermore, the density of threading dislocation on the junction interface can be set to within a range of 0 to 1010 dislocations/cm2 (in this case 0 dislocations/cm$^2$).

The group III-V compound semiconductor nanowire formed can further be doped to be an n-type or p-type. For example, it is possible to dope an n-type dopant or p-type dopant to the group III-V compound semiconductor nanowire by supplying a doping gas or doping organic metal while forming the group III-V compound semiconductor nanowire using an MOVPE method. For example, after forming the first region of the group III-V compound semiconductor nanowire using the MOVPE method, by simultaneously supplying a gas containing group IV atoms or the organic metal material and the material of the group III-V compound semiconductor nanowire, it is possible to form the n-type group III-V compound semiconductor nanowire which becomes a second region. Similarly, after forming the first region of the group III-V compound semiconductor nanowire, by simultaneously supplying a gas containing group VI atoms or the organic metal material and the material of the group III-V compound semiconductor nanowire, it is possible to form the p-type group III-V compound semiconductor nanowire which becomes a second region. In addition, by implanting ions made of group IV atoms into the group III-V compound semiconductor nanowire corresponding to the first region using an ion implantation method, an n-type group III-V compound semiconductor nanowire can be formed. Similarly, by implanting ions made of group VI atoms into the group III-V compound semiconductor nanowire corresponding to the first region, a p-type group III-V compound semiconductor nanowire can be formed.

3) Formation of Gate Electrode

In the third step, the gate electrode is formed. Normally, a gate dielectric film is formed on the channel region (group III-V compound semiconductor nanowire or group IV semiconductor substrate) of the TFET of the present invention and the gate electrode is formed thereon. The method of forming the gate dielectric film is not particularly limited. For example, a film made of silicon oxide ($SiO_2$), aluminum oxide ($Al_2O_3$), hafnium oxide ($HfO_2$) or zirconium oxide ($ZrO_2$) may be formed using an ALD method or the like. Furthermore, the method of forming the gate electrode is not particularly limited.

For example, using a photolithography method, a region other than a portion on which an electrode is scheduled to be formed is masked with a resist film, metal such as gold, platinum, titanium, chromium, aluminum, palladium, molybdenum or semiconductor such as polysilicon may be made to vapor-deposit and the resist film may be removed (liftoff).

Furthermore, after making titanium vapor-deposit, gold is further made to vapor-deposit, superimpose on titanium so as to form an electrode of a two-layer structure.

4) Formation of Source Electrode and Drain Electrode

In the fourth step, the source electrode and drain electrode are formed. The method of forming the source electrode and drain electrode is not particularly limited. For example, the source electrode and drain electrode may be formed using a photolithography method as in the case of the gate electrode. Furthermore, before forming the source electrode and drain electrode, an insulating protective film for protecting the group III-V compound semiconductor nanowire, gate dielectric film and gate electrode may be formed. The insulating protective film is a film made of, for example, insulating resin.

The TFET of the present invention can be manufactured through the above procedure.

The TFET manufacturing method according to the present invention forms the group III-V compound semiconductor nanowire without using any metal catalyst, and can thereby form a device with a high definition crystal structure without being affected by metal contamination. Furthermore, the TFET manufacturing method of the present invention can manufacture a TFET having a desired characteristic without using any precise doping technique by selecting the type of the group IV semiconductor and group III-V compound semiconductor as appropriate. Furthermore, according to the TFET manufacturing method of the present invention, when a nanowire made of mixed crystal semiconductor such as InGaAs is formed, only changing the In composition causes band discontinuities on the junction interface to demonstrate opposite features. Therefore, using this feature, it is possible to manufacture TFETs demonstrating different switch characteristics by only growing the group III-V compound semiconductor nanowire once.

Hereinafter, a tunnel field effect transistor (TFET) of the present invention will be described in detail with reference to the accompanying drawings.

Embodiment 1

Embodiment 1 will show an example of a TFET of the present invention manufactured using a silicon (111) substrate high doped to be a p-type.

Figure 4:
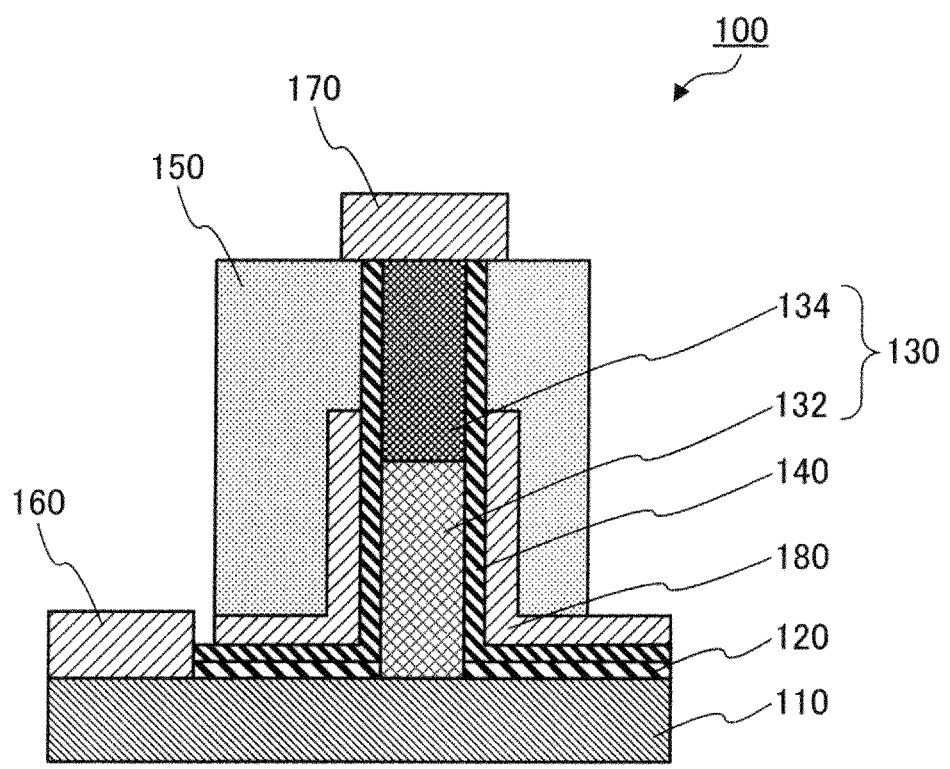
FIG. 4 is a cross-sectional view showing a configuration of a TFET according to Embodiment 1.

FIG. 4 is a cross-sectional view showing a configuration of the TFET according to Embodiment 1. As shown in FIG. 4, TFET 100 of Embodiment 1 includes high p-type doped silicon substrate 110, insulating film 120, group III-V compound semiconductor nanowire 130, gate dielectric film 140, insulating protective film 150, source electrode 160, drain electrode 170 and gate electrode 180. Group III-V compound semiconductor nanowire 130 is made up of undoped first region 132 and high n-type doped second region 134.

Silicon substrate 110 is a high p-type doped silicon (111) substrate.

Insulating film 120 is an insulating film that covers a surface ((111) surface) of the two surfaces of p-type silicon substrate 110 on which at least group III-V compound semiconductor nanowire 130 is arranged. Insulating film 120 is a silicon oxide ($SiO_2$) film having a film thickness of, for example, 20 nm. Insulating film 120 may or may not be formed on the other surface (surface on which group III-V compound semiconductor nanowire 130 is not arranged) of p-type silicon substrate 110. P-type silicon substrate 110 and group III-V compound semiconductor nanowire 130, and p-type silicon substrate 110 and source electrode 160 have direct contact with each other to form an interface, and therefore insulating film 120 does not exist on the interface.

Group III-V compound semiconductor nanowire 130 is a nanowire made of group III-V compound semiconductor having, for example, a diameter of 20 nm and a length of 300 nm. Group III-V compound semiconductor nanowire 130 is arranged on the (111) surface of p-type silicon substrate 110 so that a longitudinal axis thereof is substantially perpendicular to the (111) surface. First region 132 (intrinsic semiconductor) of the group III-V compound semiconductor nanowire is located closer to the p-type silicon substrate 110 side (p-type semiconductor) than second region 134 (n-type semiconductor). First region 132 of the group III-V compound semiconductor nanowire and the (111) surface of p-type silicon substrate 110 form a junction interface basically including neither dislocation nor defect.

Gate dielectric film 140 is an insulating film that covers the side surface (entire surface except both end faces) of group III-V compound semiconductor nanowire 130. Gate dielectric film 140 is a high dielectric film such as hafnium aluminate (HfAlOx) film.

Insulating protective film 150 is a film made of insulating resin that covers group III-V compound semiconductor nanowire 130, gate dielectric film 140 and gate electrode 180.

Source electrode 160 is arranged on p-type silicon substrate 110 and is connected to p-type silicon substrate 110 (p-type semiconductor). Source electrode 160 is a Ti/Au alloy film formed on p-type silicon substrate 110, for example. Source electrode 160 may also be arranged on the surface out of the two surfaces of p-type silicon substrate 110 on which group III-V compound semiconductor nanowire 130 is arranged or may also be arranged on the other surface of the silicon substrate (surface on which group III-V compound semiconductor nanowire 130 is not arranged).

Drain electrode 170 is arranged on group III-V compound semiconductor nanowire 130 and insulating protective film 150 and is connected to second region 134 (n-type semiconductor) of the group III-V compound semiconductor nanowire. Drain electrode 170 is, for example, a Ti/Au alloy film or Ge/Au/Ni/Au alloy film arranged on group III-V compound semiconductor nanowire 130 and insulating protective film 150. Gate electrode 180 is arranged on gate dielectric film 140 so as to cover the perimeter of first region 132 of the group III-V compound semiconductor nanowire. Gate electrode 180 is, for example, a Ti/Au alloy film formed on gate dielectric film 140.

FIG. 5 is a schematic view showing a method of manufacturing TFET 100 of Embodiment 1. Hereinafter, the method of manufacturing TFET 100 of Embodiment 1 will be described with reference to FIG. 5.

Figure 5A:
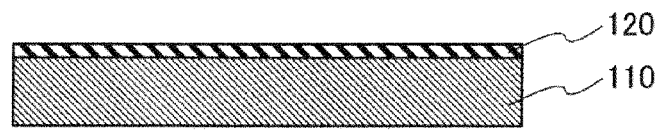
FIG. 5 is a schematic view showing manufacturing steps of the TFET of Embodiment 1.
Figure 5B:
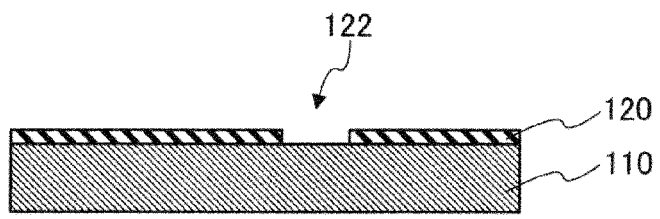
Figure 5C:
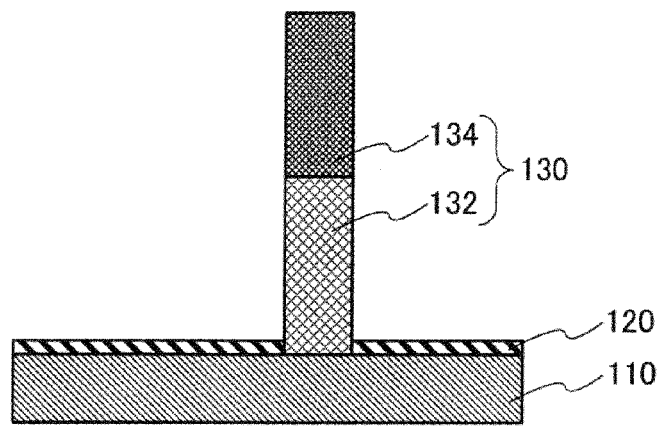
Figure 5D:
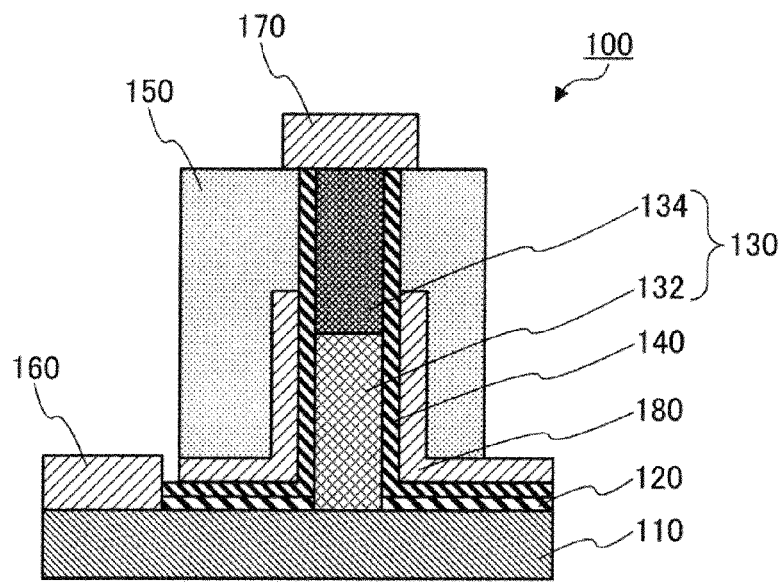

First, as shown in FIG. 5A, p-type silicon substrate 110 is prepared. Insulating film 120 made of silicon oxide ($SiO_2$) having a film thickness of 20 nm is formed on this p-type silicon substrate 110 using a thermal oxidation method. Next, as shown in FIG. 5B, opening 122 having a diameter of 20 nm is formed in insulating film 120 on p-type silicon substrate 110 using a photolithography method or the like. Next, as shown in FIG. 5C, group III-V compound semiconductor nanowire 130 is made to grow from the (111) surface of p-type silicon substrate 110 exposed through the opening using an MOVPE method. At this time, it is preferable to form a thin film of group III-V compound semiconductor on the (111) surface of p-type silicon substrate 110 using an alternate raw material supply modulation method before growing group III-V compound semiconductor nanowire 130. Furthermore, immediately after forming group III-V compound semiconductor nanowire 130, second region 134 of the group III-V compound semiconductor nanowire is doped so that undoped first region 132 and high n-type doped second region 134 are formed. Finally, gate dielectric film 140, insulating protective film 150, source electrode 160, drain electrode 170 and gate electrode 180 are formed as shown in FIG. 5D.

Figure 6:
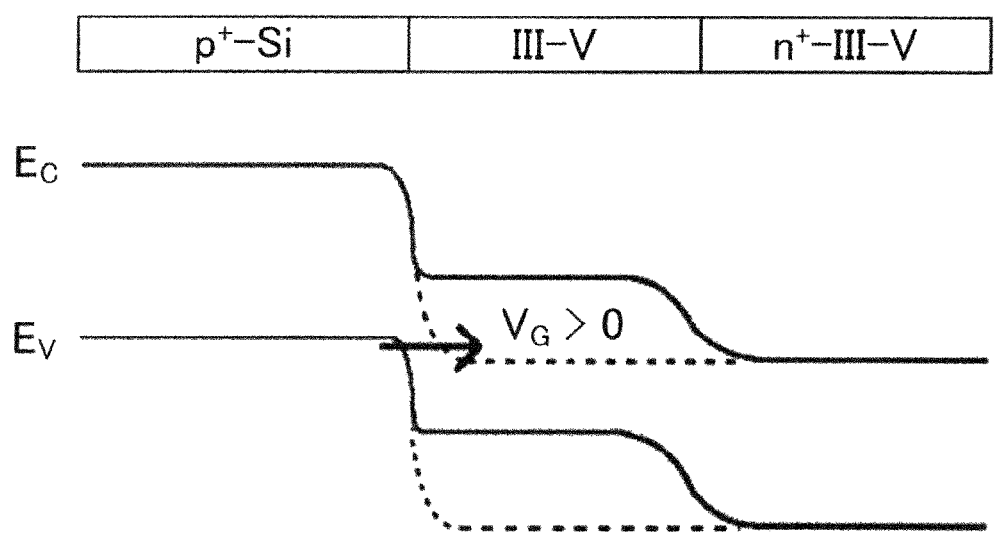
FIG. 6 is a schematic view of a band structure of the TFET of Embodiment 1.

In TFET 100 of Embodiment 1, the bonded surface of first region 132 of the group III-V compound semiconductor nanowire and the (111) surface of silicon substrate 110 functions as a tunnel layer. As shown in FIG. 6, in TFET 100 of the present embodiment, carriers in p-type silicon substrate 110 move into group III-V compound semiconductor nanowire 130 (set in an ON state) through a tunnel phenomenon by applying a positive bias to gate electrode 180. This operation corresponds to a switch operation of an n-type MOSFET of a CMOS switch. Furthermore, the height of an energy barrier of the junction interface varies depending on the type of the group III-V compound semiconductor making up group III-V compound semiconductor nanowire 130, and therefore it is possible to arbitrarily control the supply voltage necessary for the ON state by changing the type of the group III-V compound semiconductor. Furthermore, since insulating protective film 150 covers the perimeter of group III-V compound semiconductor nanowire 130, a plurality of TFETs 100 can also be integrated.

Embodiment 2

Embodiment 2 shows an example of TFET according to the present invention manufactured using a high n-type doped silicon (111) substrate.

Figure 7:
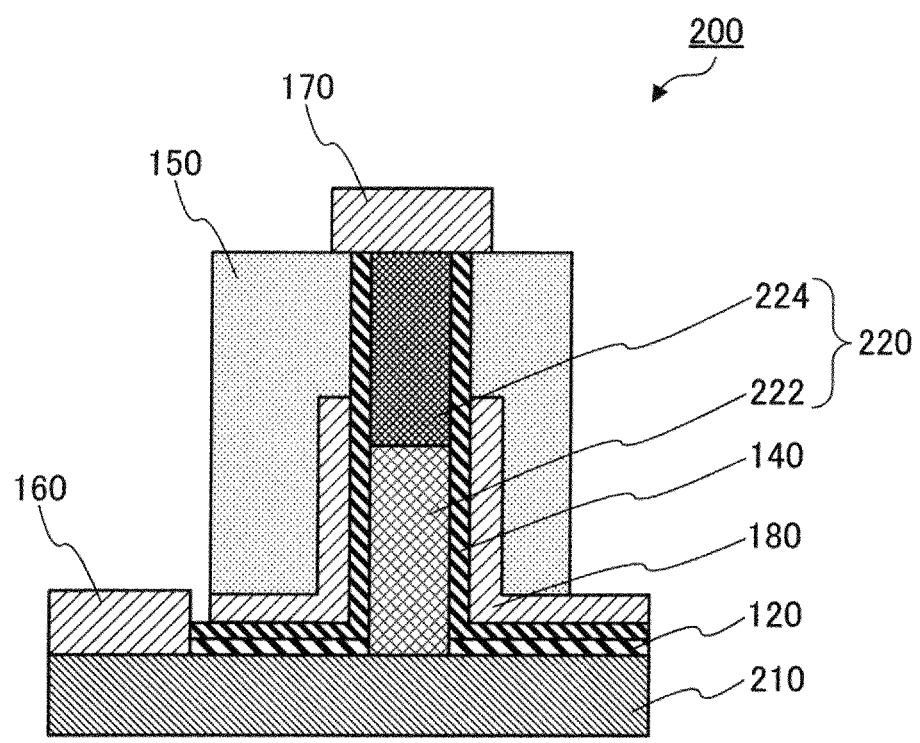
FIG. 7 is a cross-sectional view showing a configuration of a TFET according to Embodiment 2.

FIG. 7 is a cross-sectional view showing a configuration of the TFET according to Embodiment 2. Configuration elements identical to those of the TFET of Embodiment 1 are assigned the same reference numerals, and duplicate descriptions thereof are omitted.

As shown in FIG. 7, TFET 200 of Embodiment 2 includes high n-type doped silicon substrate 210, insulating film 120, group III-V compound semiconductor nanowire 220, gate dielectric film 140, insulating protective film 150, source electrode 160, drain electrode 170 and gate electrode 180. Group III-V compound semiconductor nanowire 220 is constructed of low n-type doped first region 222 and high p-type doped second region 224.

Silicon substrate 210 is a high n-type doped silicon (111) substrate.

Group III-V compound semiconductor nanowire 220 is a nanowire made of group III-V compound semiconductor having, for example, a diameter of 20 nm and a length of 300 nm. Group III-V compound semiconductor nanowire 220 is arranged on the (111) surface of n-type silicon substrate 210 so that a longitudinal axis thereof is substantially perpendicular to the (111) surface. First region 222 (n-type semiconductor) of the group III-V compound semiconductor nanowire is located closer to the silicon substrate 210 side than second region 224 (p-type semiconductor). First region 222 of the group III-V compound semiconductor nanowire and the (111) surface of n-type silicon substrate 210 form a junction interface basically including neither dislocation nor defect.

Figure 8:
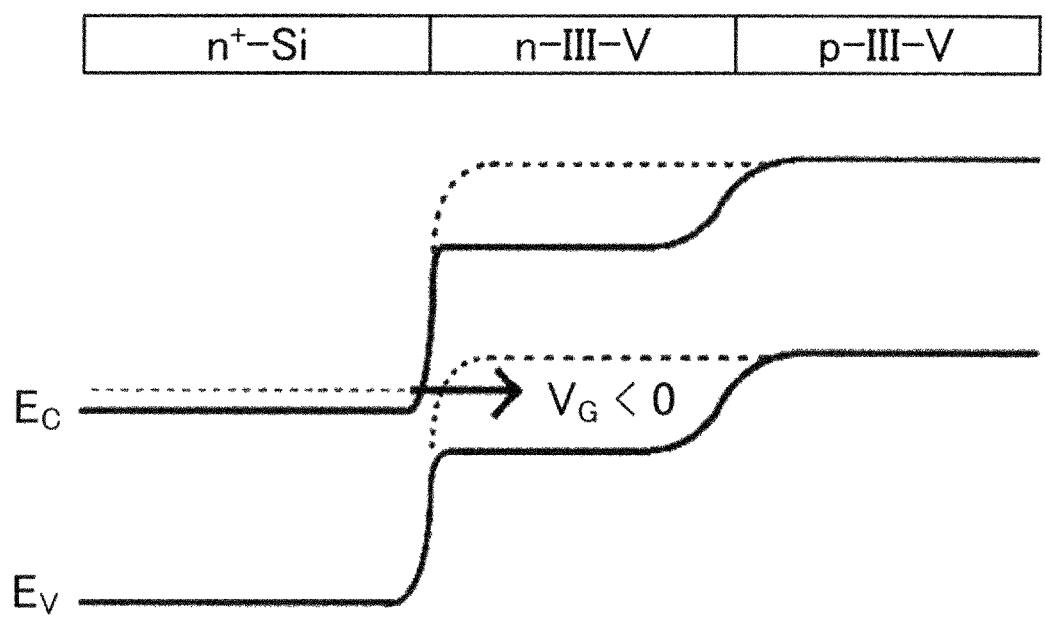
FIG. 8 is a schematic view of a band structure of the TFET of Embodiment 2.

TFET 200 according to Embodiment 2 can be manufactured using a procedure similar to that of TFET 100 of Embodiment 1. In TFET 200 of Embodiment 2, the bonded surface of first region 222 of the group III-V compound semiconductor nanowire and the (111) surface of n-type silicon substrate 210 functions as a tunnel layer. As shown in FIG. 8, in TFET 200 of the present embodiment, carriers in n-type silicon substrate 210 move into group III-V compound semiconductor nanowire 220 (an ON state is set) through a tunnel phenomenon by applying a negative bias to gate electrode 180. This operation corresponds to a switch operation of a p-type MOSFET of a CMOS switch. Furthermore, since the height of an energy barrier of the junction interface varies depending on the type of the group III-V compound semiconductor making up group III-V compound semiconductor nanowire 220, it is possible to arbitrarily control a supply voltage necessary for an ON state by changing the type of the group III-V compound semiconductor. Furthermore, since insulating protective film 150 covers the periphery of group III-V compound semiconductor nanowire 220, a plurality of TFETs 200 can be integrated.

Embodiment 3

Embodiment 3 shows an example of a TFET according to the present invention manufactured using a low p-type doped silicon (100) substrate.

Figure 9:
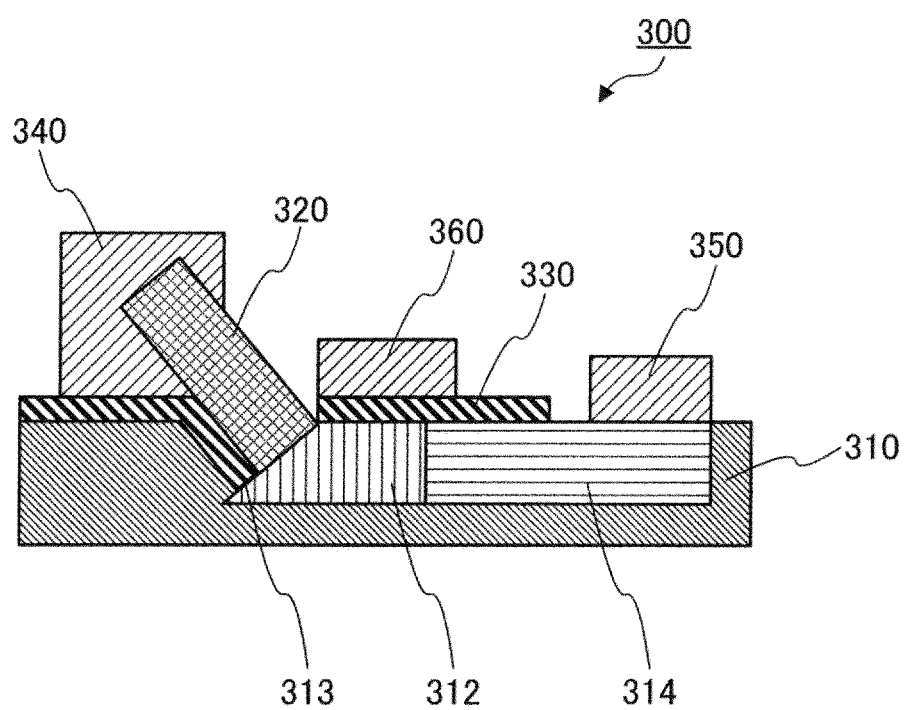
FIG. 9 is a cross-sectional view showing a configuration of a TFET according to Embodiment 3.

FIG. 9 is a cross-sectional view showing a configuration of the TFET of Embodiment 3. As shown in FIG. 9, TFET 300 of Embodiment 3 includes low p-type doped silicon substrate 310, low p-type doped group III-V compound semiconductor nanowire 320, insulating film (gate dielectric film) 330, source electrode 340, drain electrode 350 and gate electrode 360. Part of the region of insulating film 330 also functions as a gate dielectric film. P-type silicon substrate 310 includes undoped first region 312 and high n-type doped second region 314.

Silicon substrate 310 is a low p-type doped silicon (100) substrate. Undoped first region 312 (intrinsic semiconductor) and high n-type doped second region 314 (n-type semiconductor) are arranged so as to neighbor each other on the surface out of the two surfaces of silicon substrate 310 on which group III-V compound semiconductor nanowire 320 is arranged. First region 312 includes not only the (100) surface but also (111) surface 313.

Group III-V compound semiconductor nanowire 320 is a nanowire made of group III-V compound semiconductor having, for example, a diameter of 20 nm and a length of 300 nm. Group III-V compound semiconductor nanowire 320 is arranged on (111) surface 313 of the first region of the silicon substrate so that a longitudinal axis thereof is substantially perpendicular to the (111) surface. Group III-V compound semiconductor nanowire 320 and (111) surface 313 of the first region of the silicon substrate form a junction interface basically including neither dislocation nor defect.

Insulating film 330 covers the whole surface ((100) surface) of first region 312 of the silicon substrate and at least part of the surface ((100) surface) of second region 314. As described above, part of the region of insulating film 330 functions as a gate dielectric film. Insulating film (gate dielectric film) 330 is a high dielectric film of, for example, a hafnium aluminate (HfAlOx) film.

Source electrode 340 is arranged on insulating film 330 on silicon substrate 310 (region other than first region 312 and second region 314) and is connected to group III-V compound semiconductor nanowire 320. Source electrode 340 is, for example, a Ti/Au alloy film formed on insulating film 330. Drain electrode 350 is arranged on second region 314 of the silicon substrate and is connected to second region 314 of the silicon substrate. Drain electrode 350 is, for example, a Ti/Au alloy film or Ge/Au/Ni/Au alloy film arranged on second region 314 of the silicon substrate.

Gate electrode 360 is arranged on insulating film (gate dielectric film) 330 on first region 312 of the silicon substrate.

Gate electrode 360 is, for example, a Ti/Au alloy film formed on gate dielectric film (insulating film) 330.

FIG. 10 is a schematic view showing a method of manufacturing TFET 300 of Embodiment 3. Hereinafter, the method of manufacturing TFET 300 of Embodiment 3 will be described with reference to FIG. 10.

Figure 10A:
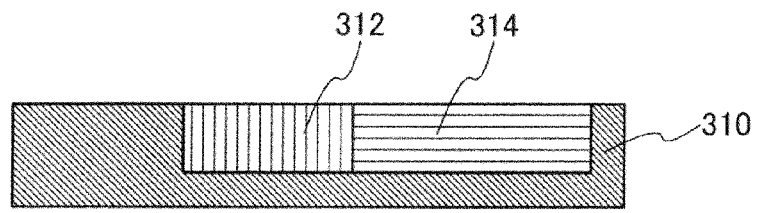
FIG. 10 is a schematic view showing manufacturing steps of the TFET of Embodiment 3.
Figure 10B:
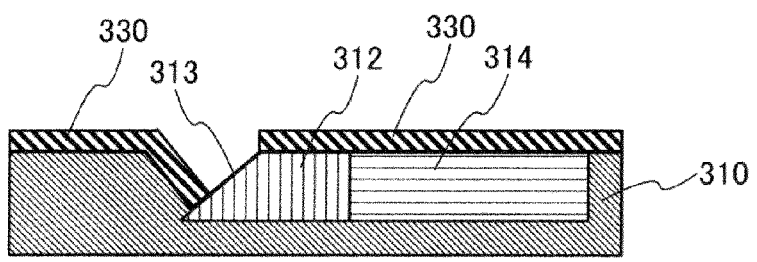
Figure 10C:
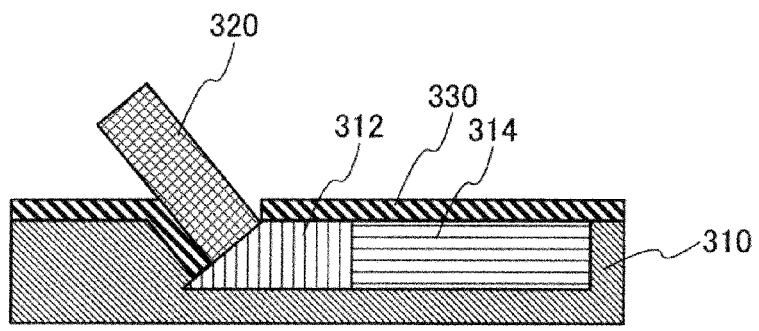
Figure 10D:
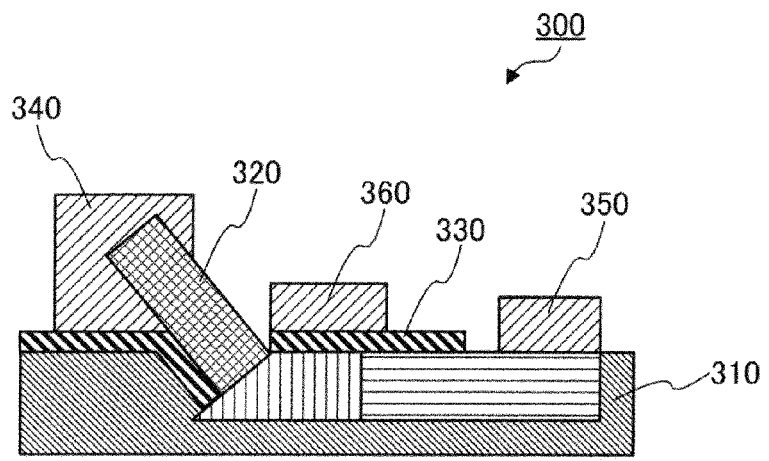

First, silicon substrate 310 is prepared as shown in FIG. 10A. Undoped first region 312 and high n-type doped second region 314 are formed on this silicon substrate 310. Next, first region 312 of the silicon substrate is subjected to anisotropic etching to expose (111) surface 313 as shown in FIG. 10B. Furthermore, insulating film 330 made of silicon oxide (SiO$_2$) having a film thickness of 20 nm is formed on the surface of silicon substrate 310 using a thermal oxidation method. An opening is formed in this insulating film 330 so that (111) surface 313 of the first region of the silicon substrate is exposed. Next, group III-V compound semiconductor nanowire 320 is grown from (111) surface 313 of the first region through the opening using an MOVPE method as shown in FIG. 10C. At this time, before growing group III-V compound semiconductor nanowire 320, it is preferable to form a thin film of the group III-V compound semiconductor on (111) surface 313 of the first region using an alternate raw material supply modulation method. Finally, source electrode 340, drain electrode 350 and gate electrode 360 are formed as shown in FIG. 10D.

Figure 11:
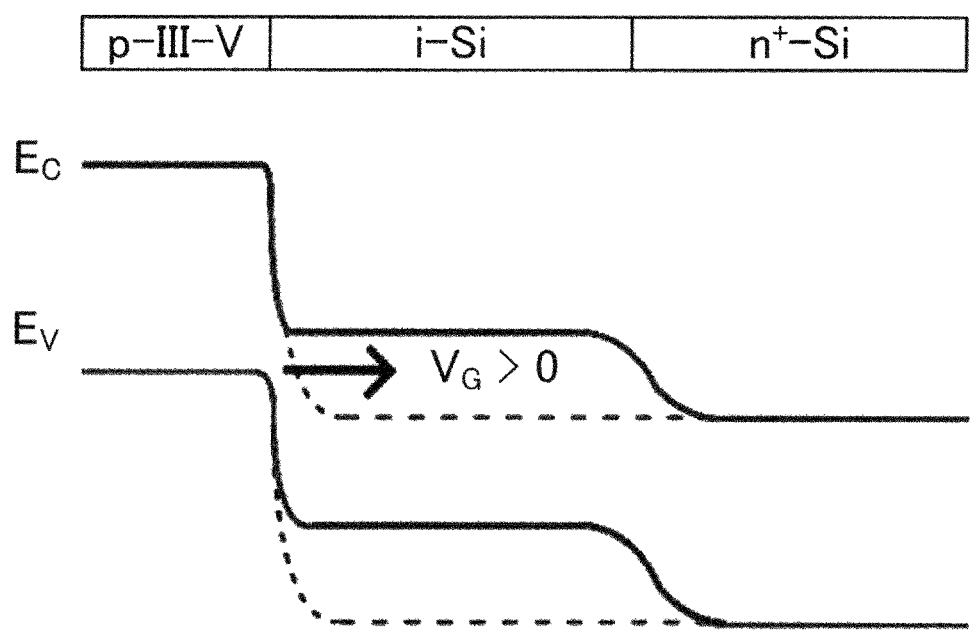
FIG. 11 is a schematic view showing a band structure of the TFET of Embodiment 3.

With TFET 300 according to the present embodiment, the bonded surface of group III-V compound semiconductor nanowire 320 and (111) surface 313 of the first region of the silicon substrate functions as a tunnel layer. As shown in FIG. 11, in TFET 300 of the present embodiment, carriers in group III-V compound semiconductor nanowire 320 move into first region 312 of the silicon substrate (an ON state is set) through a tunnel phenomenon by applying a positive bias to gate electrode 360. This operation corresponds to a switch operation of an n-type MOSFET of a CMOS switch. Furthermore, since the height of an energy barrier of the junction interface varies depending on the type of the group III-V compound semiconductor making up group III-V compound semiconductor nanowire 320, it is possible to arbitrarily control a supply voltage necessary for the ON state by changing the type of the group III-V compound semiconductor. Furthermore, TFET 300 of the present embodiment can also be integrated on a silicon (100) substrate which is currently generally used.

Embodiment 4

Embodiment 4 shows an example of a TFET according to the present invention manufactured using a low n-type doped silicon (100) substrate.

Figure 12:
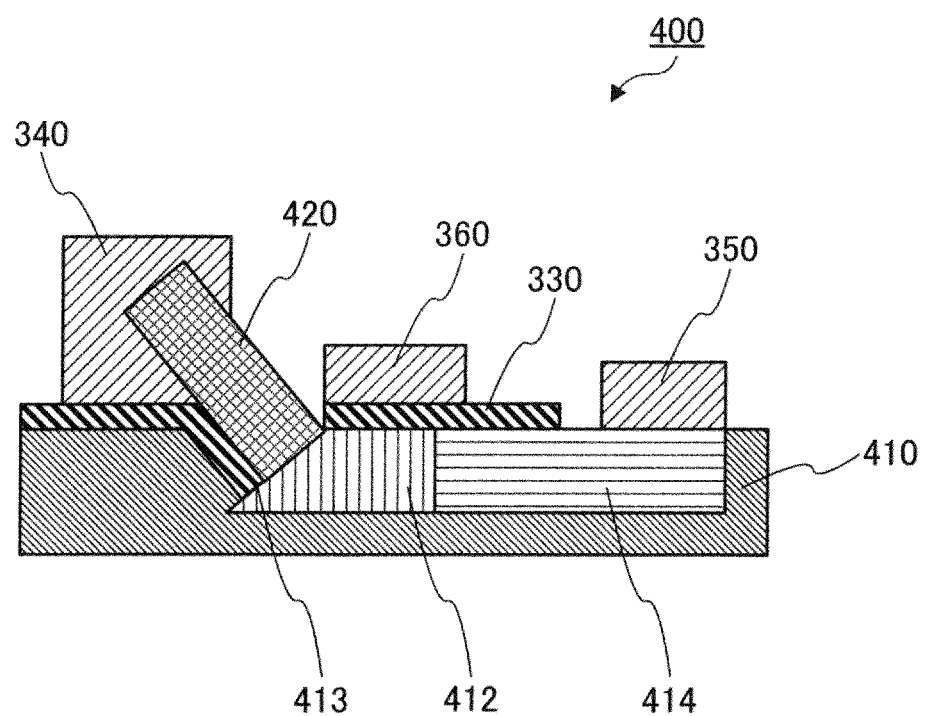
FIG. 12 is a cross-sectional view showing a configuration of a TFET according to Embodiment 4.

FIG. 12 is a cross-sectional view showing a configuration of the TFET of Embodiment 4. Configuration elements identical to those of the TFET of Embodiment 3 are assigned the same reference numerals, and duplicate descriptions thereof are omitted.

As shown in FIG. 12, TFET 400 of Embodiment 4 includes low n-type doped silicon substrate 410, undoped group III-V compound semiconductor nanowire 420, insulating film (gate dielectric film) 330, source electrode 340, drain electrode 350 and gate electrode 360. Silicon substrate 410 includes undoped first region 412 and high p-type doped second region 414.

Silicon substrate 410 is a low n-type doped silicon (100) substrate. Undoped first region 412 (intrinsic semiconductor) and low p-type doped second region 414 (p-type semiconductor) are formed so as to neighbor each other on the surface out of the two surfaces of silicon substrate 410 on which group III-V compound semiconductor nanowire 420 is arranged. First region 412 includes not only the (100) surface but also (111) surface 413.

Group III-V compound semiconductor nanowire 420 is a nanowire made of group III-V compound semiconductor having, for example, a diameter of 20 nm and a length of 300 nm. Group III-V compound semiconductor nanowire 420 is arranged on (111) surface 413 of the first region of the silicon substrate so that a longitudinal axis thereof is substantially perpendicular to the (111) surface. Group III-V compound semiconductor nanowire 420 and (111) surface 413 of the first region of the silicon substrate form a junction interface basically including neither dislocation nor defect.

TFET 400 of Embodiment 4 can be manufactured using a procedure similar to that of TFET 300 of Embodiment 3.

Figure 13:
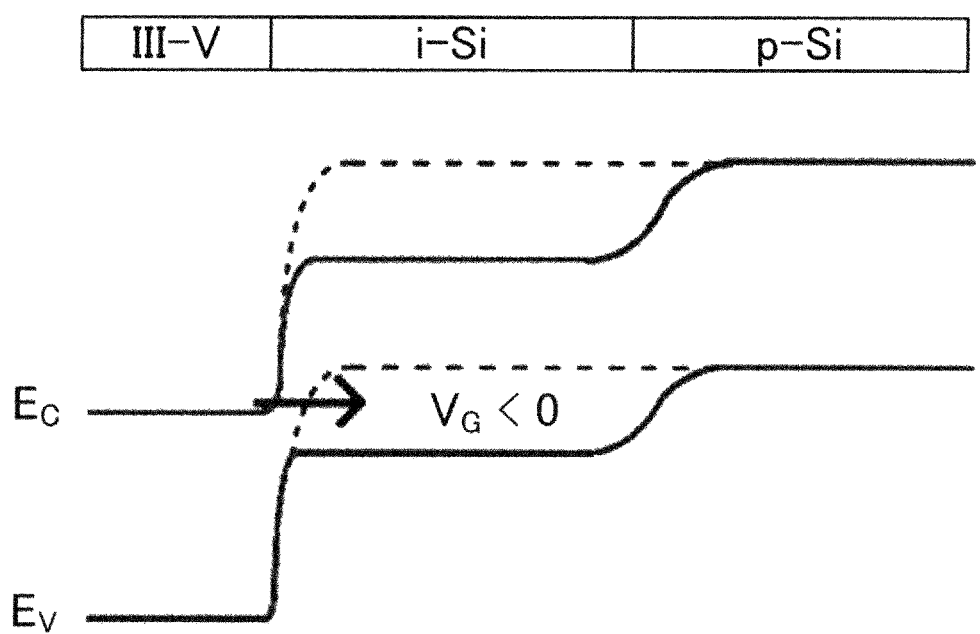
FIG. 13 is a schematic view showing a band structure of the TFET of Embodiment 4.

In TFET 400 of the present embodiment, the bonded surface between group III-V compound semiconductor nanowire 420 and (111) surface 413 of the first region of the silicon substrate functions as a tunnel layer. As shown in FIG. 13, in TFET 400 of the present embodiment, carriers in group III-V compound semiconductor nanowire 420 move into first region 412 of the silicon substrate (an ON state is set) through a tunnel phenomenon by applying a negative bias to gate electrode 360. This operation corresponds to a switch operation of a p-type MOSFET of a CMOS switch. Furthermore, since the height of an energy barrier of the junction interface varies depending on the type of the group III-V compound semiconductor making up the group III-V compound semiconductor nanowire 420, it is possible to arbitrarily control a supply voltage necessary for an ON state by changing the type of the group III-V compound semiconductor. Furthermore, TFET 400 of the present embodiment can also be integrated on the silicon (100) substrate which is currently generally used.

Embodiment 5

Embodiment 5 shows an example of a TFET according to the present invention manufactured using a silicon substrate having a silicon layer in an opening of an insulating film.

Figure 14:
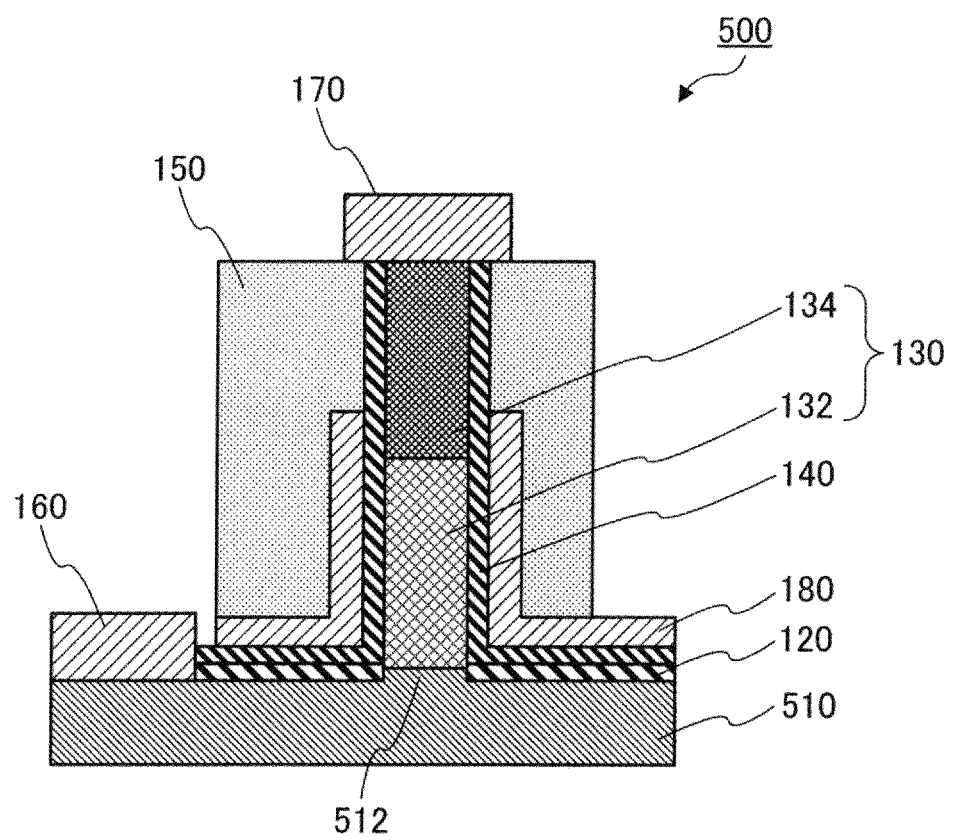
FIG. 14 is a cross-sectional view showing a configuration of a TFET according to Embodiment 5.

FIG. 14 is a cross-sectional view showing a configuration of the TFET of Embodiment 5. Configuration elements identical to those of the TFET of Embodiment 1 are assigned the same reference numerals, and duplicate descriptions thereof are omitted.

As shown in FIG. 14, TFET 500 of Embodiment 5 includes high p-type doped silicon substrate 510, insulating film 120, group III-V compound semiconductor nanowire 130, gate dielectric film 140, insulating protective film 150, source electrode 160, drain electrode 170 and gate electrode 180. Silicon substrate 510 has silicon layer 512 whose surface is a (111) surface. Group III-V compound semiconductor nanowire 130 is made up of undoped first region 132 and high n-type doped second region 134.

Silicon substrate 510 is a high p-type doped silicon (111) substrate. Silicon substrate 510 includes silicon layer 512 in an opening of insulating film 120. Silicon layer 512 is a thin film made of silicon, for example, having a diameter of 20 nm (same as the diameter of the opening) and a thickness of 10 nm (equal to or less than the thickness of the insulating film). Silicon layer 512 is high p-type doped as in the case of silicon substrate 510. Furthermore, the surface of silicon layer 512 is a (111) surface.

Group III-V compound semiconductor nanowire 130 is a nanowire made of group III-V compound semiconductor having, for example, a diameter of 20 nm and a length of 300 nm.

Group III-V compound semiconductor nanowire 130 is arranged on the (111) surface of p-type silicon substrate 510, to be more specific, on the surface ((111) surface) of silicon layer 512. First region 132 (intrinsic semiconductor) of the group III-V compound semiconductor nanowire is located closer to the silicon substrate 510 side than second region 134 (n-type semiconductor). First region 132 of the group III-V compound semiconductor nanowire and the (111) surface of p-type silicon substrate 510 (to be more specific, (111) surface of silicon layer 512) form a junction interface basically including neither dislocation nor defect.

FIG. 15 is a schematic view showing a method of manufacturing TFET 500 of Embodiment 5. Hereinafter, the method of manufacturing TFET 500 of Embodiment 5 will be described with reference to FIG. 15.

Figure 15A:
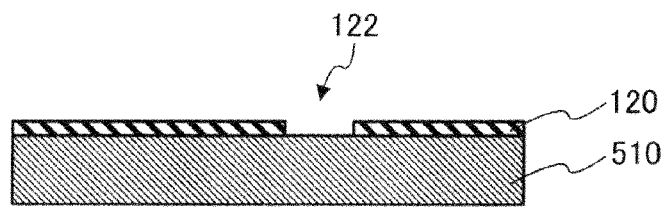
FIG. 15 is a schematic view showing manufacturing steps of the TFET of Embodiment 5.
Figure 15B:
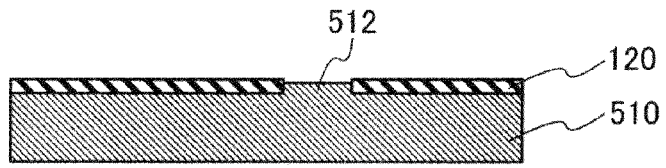
Figure 15C:
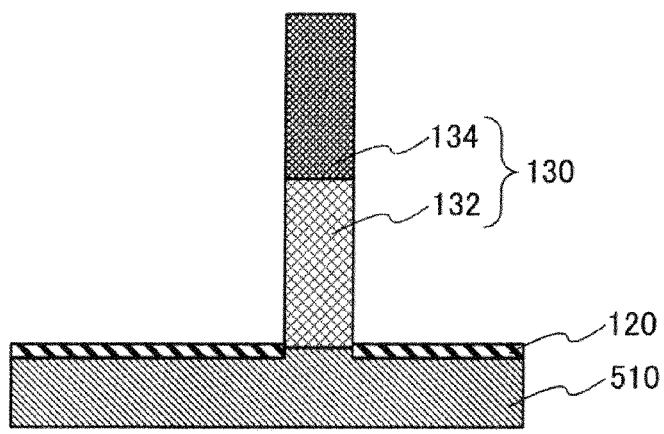
Figure 15D:
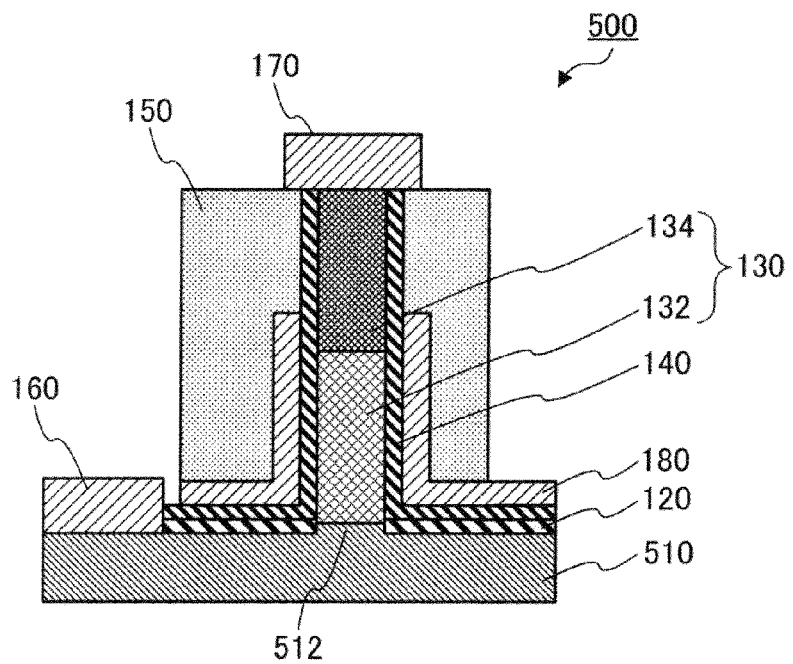

First, as shown in FIG. 15A, p-type silicon substrate 510 is prepared. Insulating film 120 made of silicon oxide ($SiO_2$) having a film thickness of 20 nm is formed on this p-type silicon substrate 510 using a thermal oxidation method. Opening 122 having a diameter of 20 nm is formed in this insulating film 120. Next, as shown in FIG. 15B, high p-type doped silicon layer 512 is formed on the (111) surface of p-type silicon substrate 510 exposed through the opening using an MOVPE method. The surface of silicon layer 512 formed in this way is a (111) surface. Next, as shown in FIG. 15C, group III-V compound semiconductor nanowire 130 is grown from the (111) surface of silicon layer 512 using the MOVPE method. At this time, before growing group III-V compound semiconductor nanowire 130, it is preferable to form a thin film of group III-V compound semiconductor on the (111) surface of silicon layer 512 using an alternate raw material supply modulation method. Furthermore, immediately after forming group III-V compound semiconductor nanowire 130, second region 134 of the group III-V compound semiconductor nanowire is doped and undoped first region 132 and high n-type doped second region 134 are formed. Finally, gate dielectric film 140, insulating protective film 150, source electrode 160, drain electrode 170 and gate electrode 180 are formed as shown in FIG. 15D.

In TFET 500 of Embodiment 5, the bonded surface of first region 132 of the group III-V compound semiconductor nanowire and the (111) surface of p-type silicon substrate 510 (to be more specific, (111) surface of silicon layer 512) functions as a tunnel layer.

In TFET 500 of Embodiment 5, silicon layer 512 is formed on the junction interface between silicon substrate 510 and group III-V compound semiconductor nanowire 130. Silicon layer 512 suppresses influences of coarseness of the surface of silicon substrate 510 and impurities in silicon substrate 510 on the junction interface. Therefore, with TFET 500 of Embodiment 5, contamination of impurities on the junction interface is effectively suppressed.

EXAMPLES

Hereinafter, the present invention will be described in detail with reference to examples, but the present invention is not limited by these examples.

Example 1

Example 1 shows a result of an operation simulation conducted on the TFET of the present invention.

1. Manufacture of Group III-V Compound Semiconductor Nanowire

The n-type silicon (111) substrate was subjected to thermal oxidation processing and a silicon oxide film having a film thickness of 20 nm was formed on the surface. Openings are periodically formed in the silicon oxide film through electron beam lithography and wet chemical etching and the surface of the silicon substrate was exposed therethrough. The shape of the opening was hexagonal and the projected area diameter of the opening was 20 nm.

The substrate in which the openings were formed was set on a sub-atmospheric transverse MOVPE apparatus (HR2339; TAIYO NIPPON SANSO CORPORATION). The internal temperature of the MOVPE apparatus was raised to 925° C., kept for five minutes to thereby remove a natural oxide film formed on the opening surface of the silicon substrate. Next, the internal temperature of the apparatus was lowered from 925° C. to 400° C. Hydrogenated arsenic was supplied together with a hydrogen gas (carrier gas). The partial pressure of hydrogenated arsenic was 1.3 $10^{-4}$ atm.

Next, a thin film of InAs (when manufacturing an InAs nanowire) or a thin film of GaAs (when manufacturing a GaAs nanowire) was formed at the opening of the silicon substrate using an alternate raw material supply modulation method. In this step, trimethyl indium or trimethyl gallium and hydrogenated arsenic were alternately supplied. To be more specific, when forming the thin film of InAs, a combination of two seconds of supply of trimethyl indium, one second of interval using a hydrogen gas, two seconds of supply of hydrogenated arsenic and one second of interval using a hydrogen gas as one cycle was repeated 20 times over two minutes. The partial pressure of trimethyl indium was $9.6 \times 10^{-7}$ atm and the partial pressure of hydrogenated arsenic was $2.5 \times 10^{-4}$ atm. When forming the thin film of GaAs, while raising the inner temperature of the apparatus from 400° C. to 750° C., a combination of two seconds of supply of trimethyl gallium, one second of interval using a hydrogen gas, two seconds of supply of hydrogenated arsenic and one second of interval using a hydrogen gas as one cycle was repeated 30 times over three minutes. The partial pressure of trimethyl indium was $1.0 \times 10^{-6}$ atm and the partial pressure of hydrogenated arsenic was $2.5 \times 10^{-4}$ atm.

Next, after raising the inner temperature of the apparatus, the InAs nanowire or GaAs nanowire was made to grow using an MOVPE method. To be more specific, when forming the InAs nanowire, trimethyl indium and hydrogenated arsenic were supplied together with a hydrogen gas after raising the inner temperature of the apparatus from 400° C. to 540° C., and then the InAs nanowire was grown. The partial pressure of trimethyl indium was $4.9 \times 10^{-7}$ atm and the partial pressure of hydrogenated arsenic was $1.3 \times 10^{-4}$ atm. When forming the GaAs nanowire, trimethyl gallium and hydrogenated arsenic were supplied together with a hydrogen gas while raising the inner temperature of the apparatus from 400° C. to 750° C. and immediately after reaching 750° C., and then the GaAs nanowire was grown. The partial pressure of trimethyl gallium was $2.5 \times 10^{-6}$ atm and the partial pressure of hydrogenated arsenic was $1.0 \times 10^{-4}$ atm.

Figure 16:
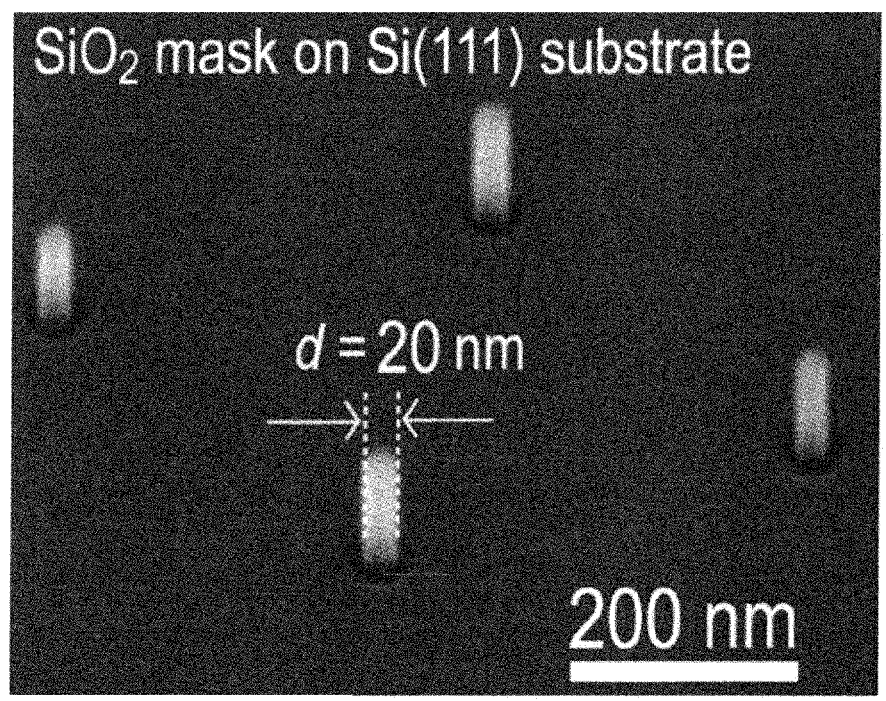
FIG. 16 is a scanning electron microscope photograph of a silicon substrate in which GaAs nanowires are periodically arrayed.

In the above-described steps, an InAs nanowire having a length of approximately 1.0 μm or a GaAs nanowire having a length of approximately 200 nm was formed on the surface of the silicon substrate. The longitudinal axes of the InAs nanowire and GaAs nanowire were perpendicular to the surface of the silicon substrate. FIG. 16 is a scanning electron microscope photograph (perspective image) of the silicon substrate in which GaAs nanowires are arranged periodically.

2. Measurement of Current-Voltage Characteristic of Group III-V Compound Semiconductor Nanowire An insulating resin (BCB resin) film was formed on the silicon substrate on which the group III-V compound semiconductor nanowire was formed and the nanowire on the silicon substrate was embedded in the insulating resin (BCB resin). Next, part of the upper side of the insulating resin film was removed through reactive ion etching and the distal end of the nanowire was exposed. A metal alloy film or metal multilayer film which could be an ohmic electrode was formed as a first electrode in the region where the nanowire was exposed. To be more specific, when the group III-V compound semiconductor nanowire was an InAs nanowire, a Ti/Au alloy film was formed. On the other hand, when the group III-V compound semiconductor nanowire was a GaAs nanowire, a Ge/Au/Ni/Au multilayer film was formed. Furthermore, a metal alloy film or metal multilayer film which could be an ohmic electrode was formed on the silicon substrate as a second electrode. To be more specific, when the group III-V compound semiconductor nanowire was an InAs nanowire, a Ti/Au alloy film was formed. On the other hand, when the group III-V compound semiconductor nanowire was an n-GaAs nanowire, a Ge/Au/Ni/Au multilayer film was formed and when the group III-V compound semiconductor nanowire was a p-GaAs nanowire, a Cr/Au multilayer film or ZnAu alloy film was formed.

Figure 17:
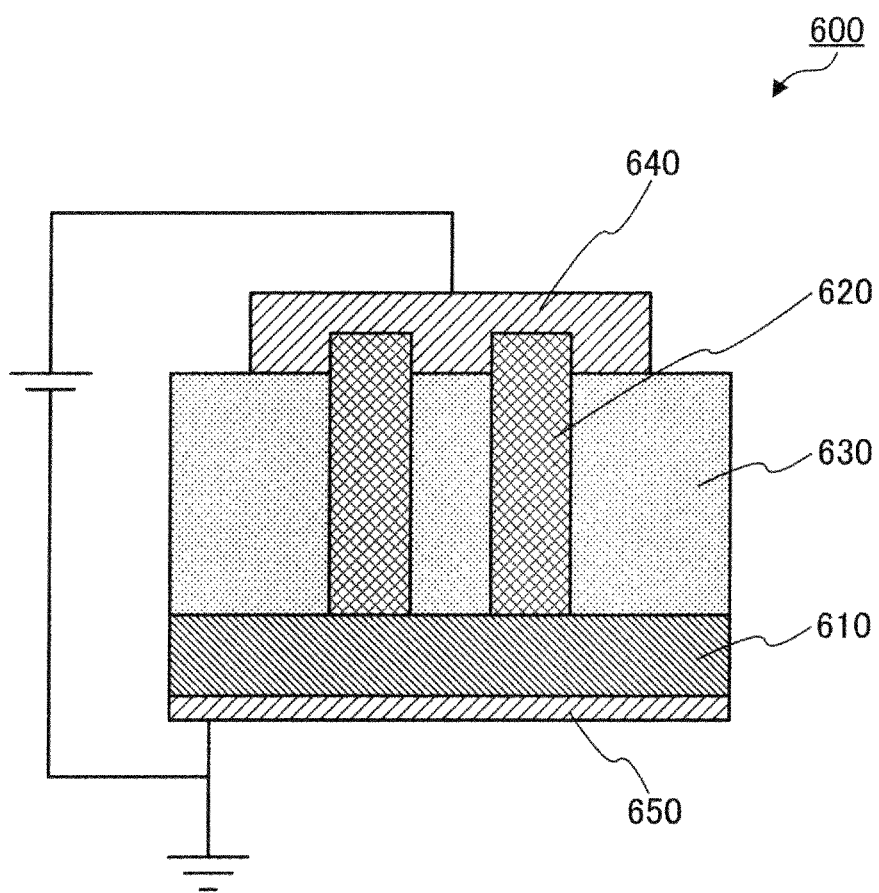
FIG. 17 is a cross-sectional view showing a configuration of a device used to measure a current-voltage characteristic.

FIG. 17 is a cross-sectional view showing a configuration of the device after the electrode is formed. As shown in FIG. 17, device 600 includes n-type silicon substrate 610, group III-V compound semiconductor nanowire 620, insulating resin (insulating protective film) 630, first electrode 640 and second electrode 650. Group III-V compound semiconductor nanowire 620 is formed on the (111) surface of n-type silicon substrate 610 and is connected to first electrode 640. Furthermore, n-type silicon substrate 610 is connected to second electrode 650.

A current-voltage characteristic of the group III-V compound semiconductor nanowire (InAs nanowire and GaAs nanowire) formed on the n-type silicon substrate was measured using the device manufactured in the above-described steps.

Figure 18A:
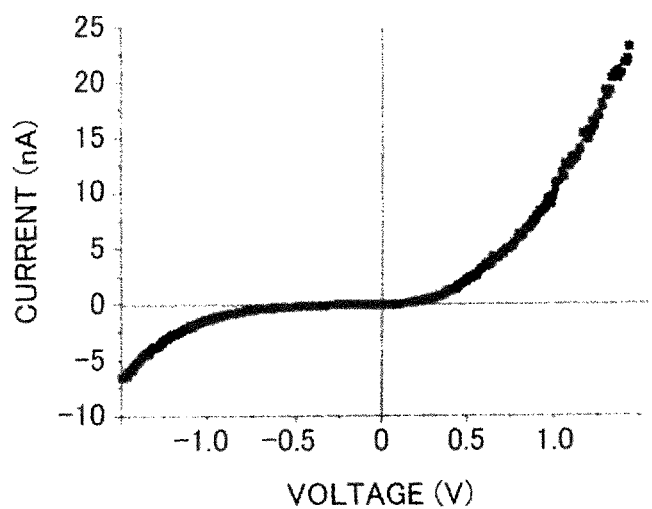
FIG. 18A is a graph showing a current-voltage curve of an InAs nanowire formed on an n-type silicon substrate.

FIG. 18A is a graph showing a current-voltage curve of the InAs nanowire formed on the n-type silicon substrate. It is seen from this graph that the current-voltage curve is a Schottky-type curve although the metal junction condition is an ohmic electrode condition. This is attributable to the fact that an energy barrier is formed on the junction interface between the n-type silicon substrate and the InAs nanowire due to band discontinuity (see FIG. 18B).

Figure 18B:
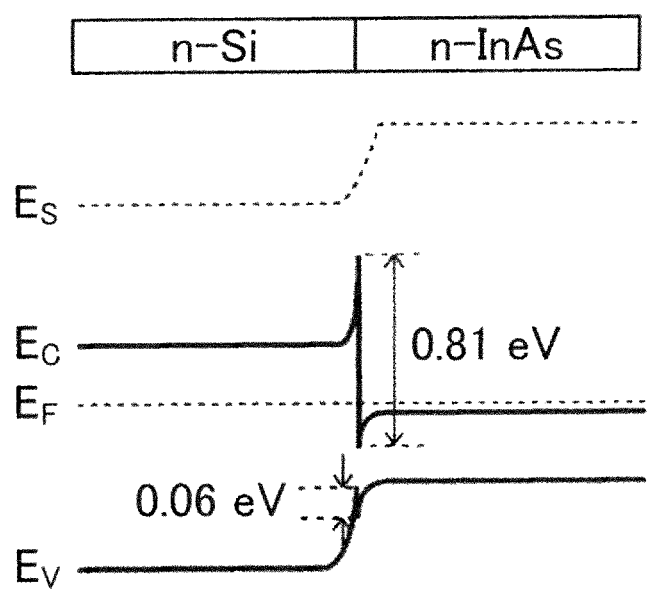
FIG. 18B is a schematic view of a band structure of n-type silicon and the InAs nanowire.

FIG. 18B is a schematic view of the band structure of the n-type silicon substrate and InAs nanowire. It is also seen from this diagram that an offset value of the conduction band in the junction interface is 0.81 eV and an offset value of the valence band is 0.06 eV. In the case of p-type silicon, it is also known that an offset value of the conduction band is 0.41 eV and an offset value of the valence band is 0.31 eV. When the offset value of the conduction band or the offset value of the valence band is within a range of 0.01 to 1.5 eV, the device including the InAs nanowire formed on the silicon substrate can function as a tunnel FET.

Figure 19A:
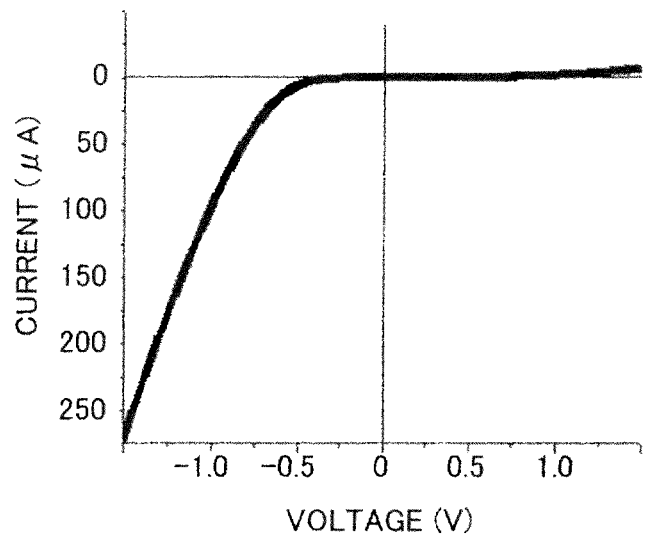
FIG. 19A is a graph showing a current-voltage curve of a GaAs nanowire formed on an n-type silicon substrate.

FIG. 19A is a graph showing a current-voltage curve of the GaAs nanowire formed on the n-type silicon substrate. It is seen from this graph that the current-voltage curve is a Schottky-type curve although the metal junction condition is an ohmic electrode condition. This is attributable to the fact that an energy barrier is formed on the junction interface between the n-type silicon substrate and the GaAs nanowire due to band discontinuity (see FIG. 19B).

Figure 19B:
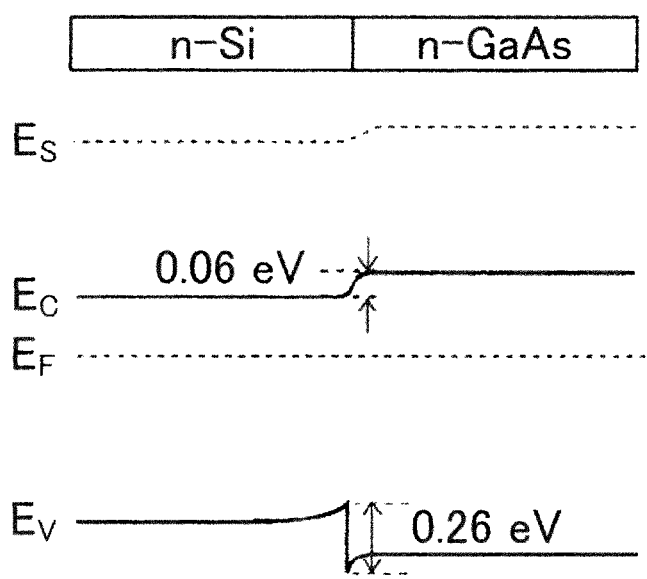
FIG. 19B is a schematic view of a band structure of n-type silicon and the GaAs nanowire.

FIG. 19B is a schematic view of the band structure of the n-type silicon substrate and GaAs nanowire. It is seen from this diagram that an offset value of the conduction band on the junction interface is 0.06 eV and an offset value of the valence band is 0.26 eV. In the case of p-type silicon, it is also known that an offset value of the conduction band is 0.58 eV and an offset value of the valence band is 0.34 eV. When the offset value of the conduction band or the offset value of the valence band is within a range of 0.01 to 1.5 eV, the device including the GaAs nanowire formed on the silicon substrate can function as a tunnel FET.

3. Operation Simulation of TFET of Present Invention

An operation simulation of the TFET of the present invention was performed using a device simulation based on the three-dimensional Poisson-Schrodinger equation. As a result, it has been proven that a tunnel phenomenon occurs on the junction interface of the silicon—group III-V compound semiconductor nanowire.

Figure 20A:
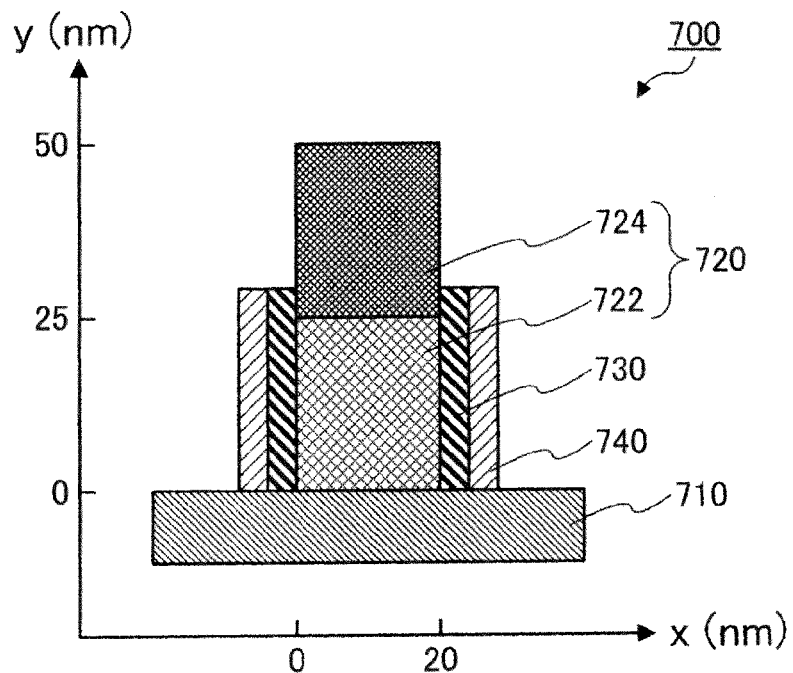
FIG. 20A is a cross-sectional view showing a configuration of the TFET of the present invention used for a simulation.

FIG. 20A is a cross-sectional view showing a structure of the TFET of the present invention used for the simulation. This TFET 700 includes p-type silicon substrate 710, InAs nanowire 720, gate dielectric film 730, gate electrode 740, source electrode (not shown) and drain electrode (not shown). InAs nanowire 720 having a diameter of 20 nm and a length of 50 nm is divided into low n-type doped first region 722 (length 25 nm) on the p-type silicon substrate 710 side and high n-type doped second region 724 (length 25 nm) on the drain electrode side (not shown). The carrier concentration of first region 722 of the InAs nanowire was assumed to be 1×1016 cm-3 and the carrier concentration of the second region 724 was assumed to be 1×1018 cm-3. The carrier concentration of p-type silicon substrate 710 was assumed to be 1×1018 cm-3. The gate dielectric film is a film made of $Al_2O_3$ having a film thickness of 2.5 nm. The graph in FIG. 18A was used as a reference for the energy barrier caused by band discontinuity between silicon and the InAs nanowire.

Figure 20B:
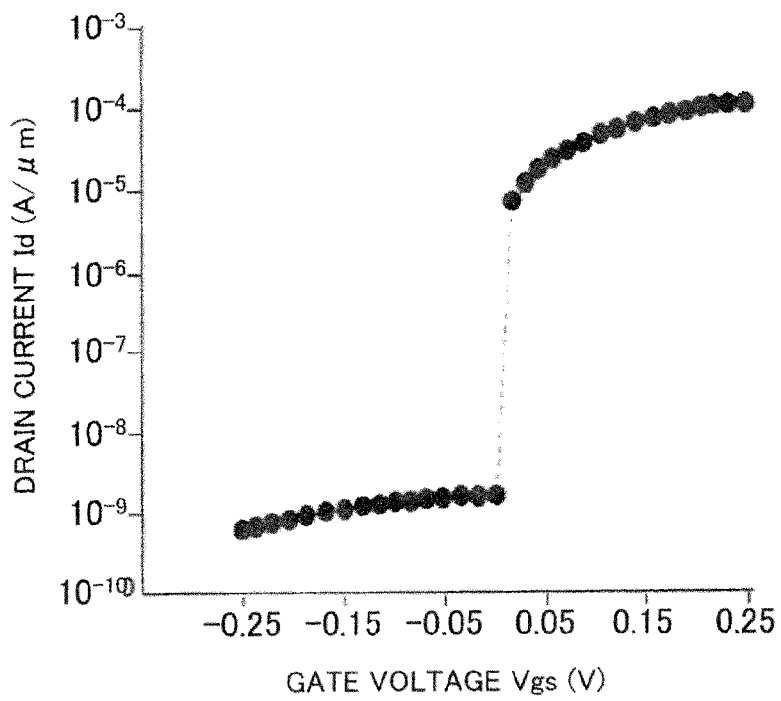
FIG. 20B is a graph showing an electric characteristic of the TFET obtained through the simulation.

FIG. 20B is a graph showing an electric characteristic of the TFET obtained through the simulation. It is seen from this graph that the TFET shown in FIG. 18A demonstrates a high ON current and a steep subthreshold characteristic of 5 mV/digit. Furthermore, when the gate voltage is 0.25 V, it is also seen that an ON/OFF ratio of 5 digits (105) can be realized.

Example 2

Example 2 shows an example where the TFET according to Embodiment 1 is manufactured.

1. Manufacture of TFET

1) Preparation of Substrate

A p-type silicon (111) substrate (carrier concentration: $7×10^{18}$ cm$^{-3}$) was subjected to thermal oxidation processing and a silicon oxide film having a film thickness of 20 nm was formed on the surface. Openings are periodically formed on the silicon oxide film through electron beam lithography and wet chemical etching and the surface of the silicon substrate was exposed. The shape of the opening was hexagonal and the projected area diameter of the opening was 100 nm.

2) Manufacture of InAs Nanowire

The substrate in which the openings were formed was set on a sub-atmospheric transverse MOVPE apparatus (HR2339; TAIYO NIPPON SANSO CORPORATION). The internal temperature of the MOVPE apparatus was raised to 925° C., kept for five minutes to thereby remove a natural oxide film formed on the opening surface of the silicon substrate. Next, the internal temperature of the apparatus was lowered from 925° C. to 400° C. Hydrogenated arsenic was supplied together with a hydrogen gas (carrier gas). The partial pressure of hydrogenated arsenic was $1.3×10^{-4}$ atm.

Next, a thin film of InAs was formed at the opening of the silicon substrate through an alternate raw material supply modulation method. To be more specific, a combination of two seconds of supply of trimethyl indium, one second of interval using a hydrogen gas, two seconds of supply of hydrogenated arsenic and one second of interval using a hydrogen gas as one cycle was repeated 20 times over two minutes. The partial pressure of trimethyl indium was $9.6 \times 10^{-7}$ atm and the partial pressure of hydrogenated arsenic was $2.5 \times 10^{-4}$ atm.

Next, after raising the inner temperature of the apparatus, the InAs nanowire having a length of 800 nm was grown using an MOVPE method. To be more specific, the inner temperature of the apparatus was raised from 400° C. to 540° C., trimethyl indium and hydrogenated arsenic were supplied together with a hydrogen gas and an InAs nanowire having a length of 500 nm (first region; carrier concentration: $2 \times 10^{17}$ cm$^{-3}$) was grown. Next, trimethyl indium and hydrogenated arsenic were supplied together with the hydrogen gas, and an n-type InAs nanowire having a length of 300 nm (second region; carrier concentration: $2 \times 10^{19}$ cm$^{-3}$) was grown. The partial pressure of trimethyl indium was $4.9 \times 10^{-7}$ atm, the partial pressure of hydrogenated arsenic was $1.3 \times 10^{-4}$ atm and the partial pressure of mono-silane was $7 \times 10^{-8}$ atm.

3) Manufacture of TFET

A gate dielectric film was formed on the silicon substrate and the side surface of the InAs nanowire, and a gate electrode was further formed thereon. To be more specific, an Hf$_{0.8}$Al$_{0.2}$O film (gate dielectric film) having a film thickness of 20 nm was formed using an ALD method. After that, a W film (gate electrode) having a film thickness of 100 nm was formed using a high frequency sputtering method.

Next, an insulating resin (BCB resin) film was formed on the silicon substrate on which a dielectric film was formed and the InAs nanowire on the silicon substrate was embedded in the insulating resin. Next, part of the top side of the insulating resin was removed through reactive ion etching and the distal end of the InAs nanowire was exposed.

Next, a multilayer film of Ti (20 nm)/Au (100 nm) having a film thickness of 120 nm was formed as a drain electrode on the surface where the InAs nanowire was exposed. Furthermore, a multilayer film of Ti (20 nm)/Au (30 nm) having a film thickness of 50 nm was formed as a source electrode on the silicon substrate.

Figure 21:
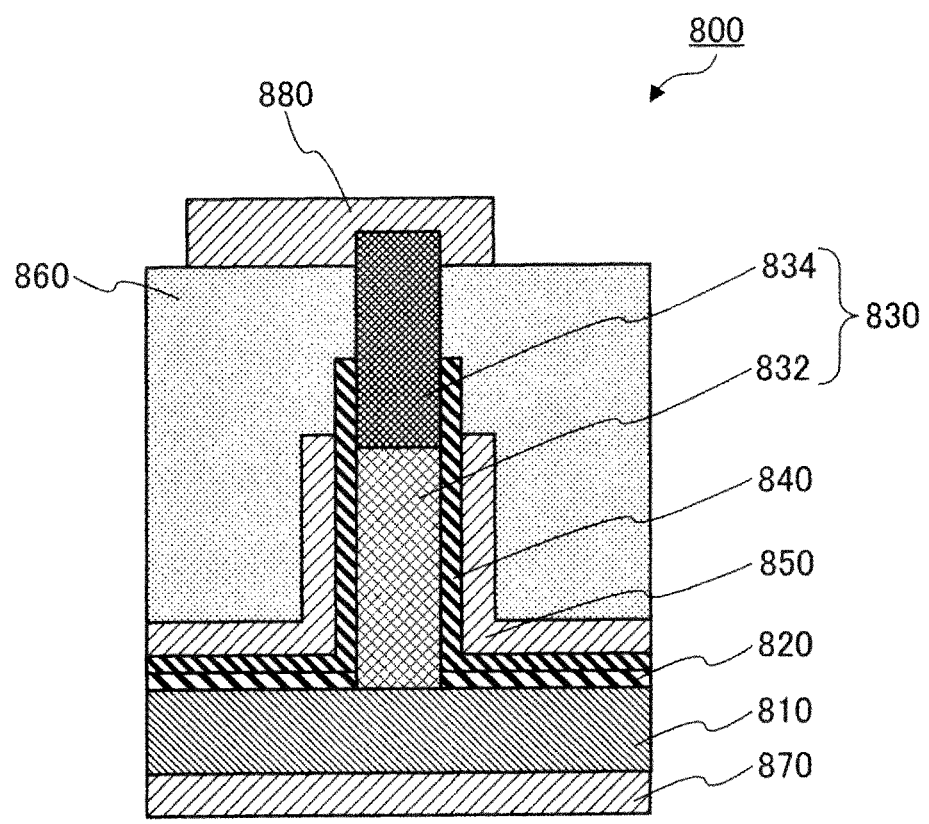
FIG. 21 is a cross-sectional view showing a configuration of a TFET manufactured in Example 2.

FIG. 21 is a cross-sectional view showing a configuration of the TFET of the present invention manufactured. As shown in FIG. 21, this TFET 800 includes p-type silicon substrate 810, silicon oxide film 820, InAs nanowire 830, gate dielectric film (Hf$_{0.8}$Al$_{0.2}$O film) 840, gate electrode (W film) 850, insulating resin (BCB resin) 860, source electrode (Ti/Au multilayer film) 870 and drain electrode (Ti/Au multilayer film) 880. InAs nanowire 830 is divided into first region 832 on the p-type silicon substrate 810 side and second region 834 on the drain electrode 880 side.

Figure 22:
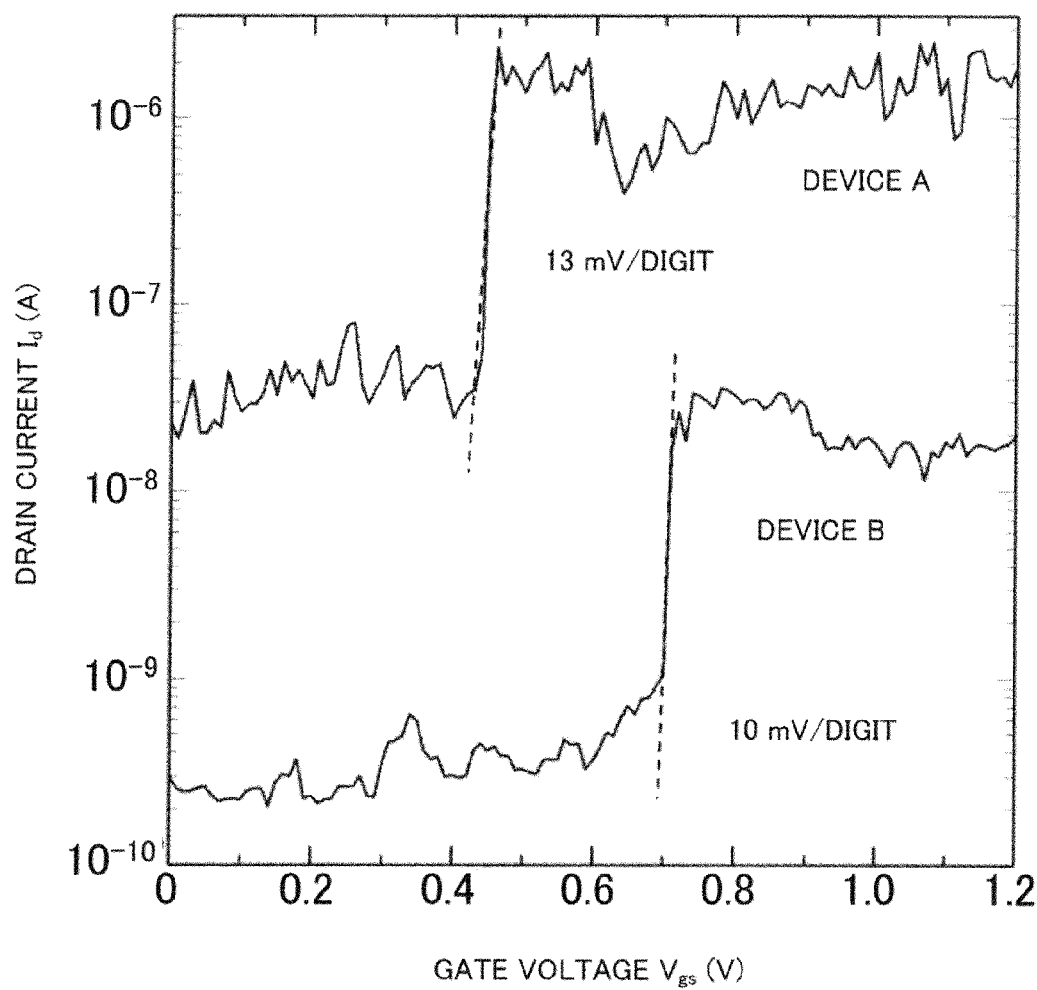
FIG. 22 is a graph showing an electric characteristic of the TFET manufactured in Example 2.

An electric characteristic of the TFET of the present invention manufactured in the above-described steps was measured. FIG. 22 is a graph showing electric characteristics of two TFETs (device A and device B). As shown in this graph, device A has a 2-digit ON/OFF ratio and has a subthreshold characteristic of 13 mV/digit. On the other hand, device B has a 2-digit ON/OFF ratio and has a subthreshold characteristic of 10 mV/digit.

It is seen from the above-described result that the TFET of the present invention can operate at a small subthreshold of 60 mV/digit or below.

In the simulation in Example 1, the ON/OFF ratio of the TFET of the present invention was 5 digits, whereas the measurement result in Example 2 shows that the ON/OFF ratio of the TFET of the present invention was 2 digits. This may be attributable to the fact that in Example 2, the diameter of the junction interface between the silicon substrate and InAs nanowire was as large as 100 nm and misfit dislocation was formed on this junction interface. Therefore, if a junction interface without misfit dislocation can be formed by, for example, reducing the diameter of the junction interface, it may be possible to further improve the ON/OFF ratio of the TFET of the present invention.

The present application claims a priority based on Japanese Patent Application No. 2009-227564, filed on Sep. 30, 2009, the disclosure of which is incorporated herein by reference in its entirety.

INDUSTRIAL APPLICABILITY

The TFET of the present invention is useful as a switch element formed on, for example, a semiconductor microprocessor and large scale integrated circuit.

REFERENCE SIGNS LIST

100, 200, 300, 400, 500, 700, 800 TFET
110, 310, 510, 710, 810 p-type silicon substrate
120, 820 insulating film
130, 220, 320, 420, 620, 720, 830 group III-V compound semiconductor nanowire
132, 222, 722 first region of group III-V compound semiconductor nanowire
134, 224, 724 second region of group III-V compound semiconductor nanowire
140, 330, 730, 840 gate dielectric film
150, 630, 860 insulating protective film
160, 340, 870 source electrode
170, 350, 880 drain electrode
180, 360, 740, 850 gate electrode
210, 410, 610 n-type silicon substrate
312 first region of p-type silicon substrate
313, 413 (111) surface
314 second region of p-type silicon substrate
412 first region of n-type silicon substrate
414 second region of n-type silicon substrate
512 silicon layer
832 first region of InAs nanowire
834 second region of InAs nanowire
640 first electrode
650 second electrode

The invention claimed is:
1. A tunnel field effect transistor comprising:
a group IV semiconductor substrate having a (111) surface and doped so as to have a first conductivity type;
a group III-V compound semiconductor nanowire arranged on the (111) surface of the group IV semiconductor substrate and containing a first region connected to the (111) surface of the group IV semiconductor substrate and a second region doped so as to have a second conductivity type different from the first conductivity type;
a source electrode that is not in contact with the group III-V compound semiconductor nanowire and is connected to the group IV semiconductor substrate;
a drain electrode connected to the second region of the group III-V compound semiconductor nanowire; and
a gate electrode for applying an electric field to an interface between the (111) surface of the group IV semiconductor substrate and the group III-V compound semiconductor nanowire.

2. The tunnel field effect transistor according to claim 1, wherein the group IV semiconductor is silicon or germanium,
the group III-V compound semiconductor is InAs, InP, GaAs, GaN, InSb, GaSb, AlSb, AlGaAs, InGaAs, InGaN, AlGaN, GaNAs, InAsSb, GaAsSb, InGaSb, AlInSb, InGaAlN, AlInGaP, InGaAsP, GaInAsN, InGaAlSb, InGaAsSb or AlInGaPSb, and
a longitudinal axis of the group III-V compound semiconductor nanowire is perpendicular to a (111) surface of the group IV semiconductor substrate.

3. The tunnel field effect transistor according to claim 1, further comprising a gate dielectric film arranged on a side surface of the group compound semiconductor nanowire, wherein:
the gate electrode is arranged on the gate dielectric film.

4. The tunnel field effect transistor according to claim 1, wherein an interface between the (111) surface of the group IV semiconductor substrate and the group III-V compound semiconductor nanowire has neither dislocation nor defect.

5. A tunnel field effect transistor comprising:
a group IV semiconductor substrate containing a first region having a (111) surface and a second region doped so as to have a first conductivity type;
a group III-V compound semiconductor nanowire arranged on the (111) surface of the first region of the group IV semiconductor substrate and undoped or doped so as to have a second conductivity type different from the first conductivity type;
a source electrode connected to the group III-V compound semiconductor nanowire;
a drain electrode that is not in contact with the group III-V compound semiconductor nanowire and is connected to the second region of the group IV semiconductor substrate; and
a gate electrode for applying an electric field to an interface between the group III-V compound semiconductor nanowire and the (111) surface of the group IV semiconductor substrate.

6. The tunnel field effect transistor according to claim 5, wherein the group IV semiconductor is silicon or germanium,
the group III-V compound semiconductor is InAs, InP, GaAs, GaN, InSb, GaSb, AlSb, AlGaAs, InGaAs, InGaN, AlCaN, GaNAs, InAsSb, GaAsSb, InGaSb, AlInSb, InGaAlN, AlInGaP, InGaAsP, GaInAsN, InGaAlSb, InGaAsSb or AlInGaPSb, and
a longitudinal axis of the group III-V compound semiconductor nanowire is perpendicular to the (111) surface of the first region of the group IV semiconductor substrate.

7. The tunnel field effect transistor according to claim 5, further comprising a gate dielectric film that is arranged on the surface of the group IV semiconductor substrate, wherein:
the gate electrode is arranged on the gate dielectric film.

8. The tunnel field effect transistor according to claim 5, wherein the interface between the (111) surface of the group IV semiconductor substrate and the group III-V compound semiconductor nanowire has neither dislocation nor defect.

9. A switch element comprising the tunnel field effect transistor according to claim 1 or 5.

* * * * *